(12) United States Patent
Zhan et al.

(10) Patent No.: US 9,287,255 B2
(45) Date of Patent: Mar. 15, 2016

(54) ESD PROTECTION DEVICE AND RELATED FABRICATION METHODS

(71) Applicants: Rouying Zhan, Gilbert, AZ (US); Chai Ean Gill, Chandler, AZ (US)

(72) Inventors: Rouying Zhan, Gilbert, AZ (US); Chai Ean Gill, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 23 days.

(21) Appl. No.: 14/327,191

(22) Filed: Jul. 9, 2014

(65) Prior Publication Data

US 2016/0013177 A1    Jan. 14, 2016

(51) Int. Cl.

| | |
|---|---|
| *H01L 29/73* | (2006.01) |
| *H01L 27/02* | (2006.01) |
| *H01L 21/84* | (2006.01) |
| *H01L 27/12* | (2006.01) |
| *H01L 29/08* | (2006.01) |
| *H01L 29/06* | (2006.01) |
| *H01L 21/8222* | (2006.01) |
| *H01L 21/265* | (2006.01) |

(52) U.S. Cl.
CPC ...... *H01L 27/0259* (2013.01); *H01L 21/26513* (2013.01); *H01L 21/8222* (2013.01); *H01L 21/84* (2013.01); *H01L 27/1203* (2013.01); *H01L 29/0649* (2013.01); *H01L 29/0804* (2013.01); *H01L 29/0821* (2013.01)

(58) Field of Classification Search
CPC ............ H01L 27/0259; H01L 29/0821; H01L 27/1203; H01L 29/0649; H01L 29/0804; H01L 21/26513; H01L 21/84; H01L 21/8222; H01L 27/0664; H02H 9/044
See application file for complete search history.

(56) References Cited

U.S. PATENT DOCUMENTS

| | | | |
|---|---|---|---|
| 6,747,294 B1 | 6/2004 | Gupta et al. | |
| 7,427,787 B2 | 9/2008 | Steinhoff | |
| 7,566,914 B2 | 7/2009 | Salcedo et al. | |
| 7,701,012 B2 | 4/2010 | Xu et al. | |
| 8,242,566 B2* | 8/2012 | Zhan | ................... H01L 27/0259 257/106 |
| 2007/0018250 A1 | 1/2007 | Cai et al. | |
| 2009/0115018 A1 | 5/2009 | Mallikarjunaswamy | |
| 2009/0213506 A1 | 8/2009 | Zhan et al. | |
| 2010/0230719 A1 | 9/2010 | Sawahata | |
| 2010/0244088 A1* | 9/2010 | Whitfield | ............ H01L 27/0259 257/106 |
| 2011/0172643 A1 | 7/2011 | Jansen et al. | |
| 2011/0175198 A1* | 7/2011 | Zhan | ................... H01L 27/0259 257/592 |
| 2011/0176244 A1 | 7/2011 | Gendron et al. | |

(Continued)

OTHER PUBLICATIONS

Zhan, R., et al., U.S. Appl. No. 13/900,256, filed May 22, 2013.

(Continued)

*Primary Examiner* — Ermias Woldegeorgis
(74) *Attorney, Agent, or Firm* — Ingrassia Fisher & Lorenz, P.C.

(57) ABSTRACT

ESD protection device structures and related fabrication methods are provided. An exemplary semiconductor protection device includes a first base well region having a first conductivity type, a collector region of the opposite conductivity type, and a second base well region having a dopant concentration greater than the first base well region, and a portion of the second base well region is disposed between the first base well region and the collector region. A third base well region with a different dopant concentration is disposed between the collector region and the second base well region. At least a portion of the first base well region is disposed between a base contact region and an emitter region within the second base well region.

20 Claims, 14 Drawing Sheets

(56) References Cited

U.S. PATENT DOCUMENTS

| | | |
|---|---|---|
| 2011/0204415 A1 | 8/2011 | Van Wijmeersch et al. |
| 2012/0119331 A1* | 5/2012 | Gendron .............. H01L 29/7436 257/587 |
| 2014/0061716 A1 | 3/2014 | Zhan et al. |
| 2014/0346560 A1 | 11/2014 | Zhan et al. |

OTHER PUBLICATIONS

Zhan, R., et al., U.S. Appl. No. 13/599,244, filed Aug. 30, 2012.

Zhan, R., et al., U.S. Appl. No. 13/900,226, filed May 22, 2013.

USPTO, Office Action for U.S. Appl. No. 13/900,256, mailed Mar. 27, 2015.

USPTO, Office Action for U.S. Appl. No. 13/900,226, mailed Jan. 12, 2015.

USPTO, Reply to Restriction Requirement for U.S. Appl. No. 13/900,226, mailed Nov. 26, 2014.

USPTO, Reply to Restriction Requirement for U.S. Appl. No. 13/900,256, mailed Nov. 26, 2014.

USPTO, Notice of Allowance for U.S. Appl. No. 13/900,256, mailed Jul. 17, 2015.

USPTO, Final Office Action for U.S. Appl. No. 13/900,226, mailed Jun. 26, 2015.

* cited by examiner

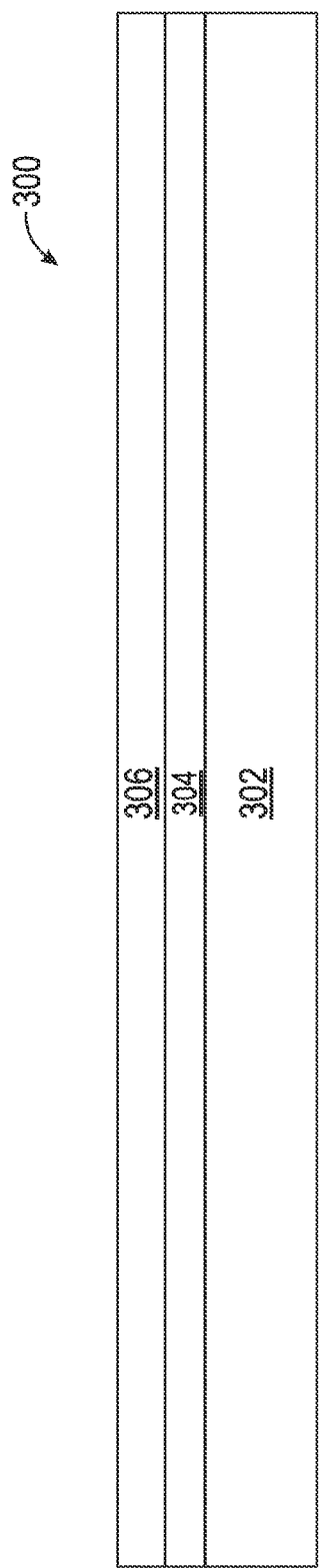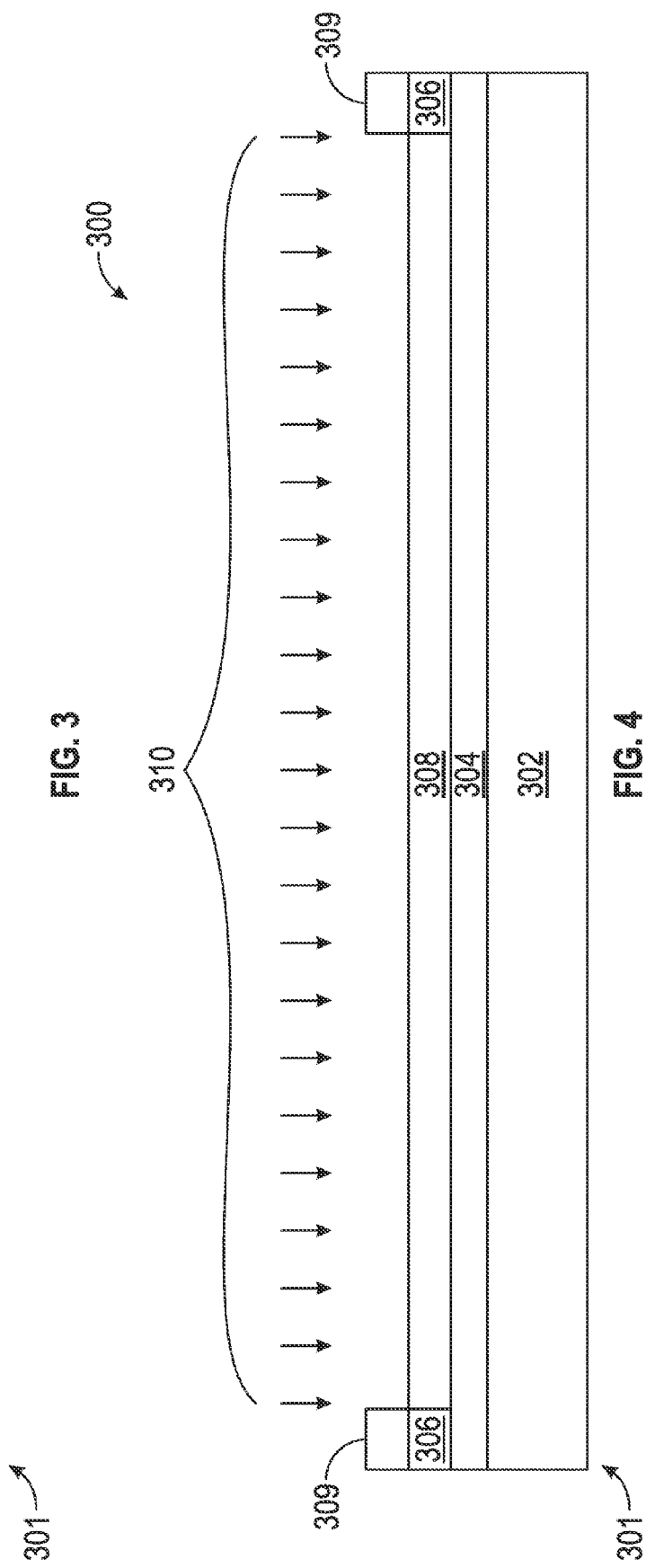

ESD PROTECTION DEVICE AND RELATED FABRICATION METHODS

TECHNICAL FIELD

Embodiments of the subject matter described herein relate generally to electronic devices, and more particularly, to electrostatic discharge protection devices and related fabrication methods.

BACKGROUND

Modern electronic devices, and particularly, integrated circuits, are at risk of damage due to electrostatic discharge (ESD) events. During an ESD event, a voltage (or current) may be provided to one or more terminals of an electronic device that causes the voltage between those terminals to exceed the designed maximum voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages across electrical components during ESD events.

To avoid interfering with normal operation of the device being protected, the discharge protection circuitry is typically designed to turn on and conduct current when the applied voltage exceeds the operating voltage of the device but before the applied voltage exceeds the breakdown voltage of the device. In practice, there is often a difference between the transient triggering voltage and the steady state (or direct current) breakdown voltage of the discharge protection circuitry. However, this voltage difference can make it difficult for the discharge protection circuitry to fit within the design window defined by the respective operating and breakdown voltages of the device to be protected (or alternatively, constrains the circuit designer to operating and breakdown voltages that accommodate the difference in triggering voltages of the protection circuitry). Additionally, when multiple instances of the discharge protection circuitry are used to provide a higher level of ESD voltage protection, the difference between transient triggering voltage and steady state breakdown is multiplied, which further constrains circuit designers.

Existing discharge protection circuitry may also be susceptible to latchup or otherwise exhibit snapback behavior, where parasitics within the discharge protection circuitry continue to conduct current at the design voltage, and thereby impair the functionality of the discharge protection circuitry after an ESD event. Thus, another concern when designing ESD protection devices is providing a snapback (or holding) voltage that exceeds the design voltage so that the ESD protection device stops conducting current when the applied voltage falls to the design voltage after an ESD event.

BRIEF DESCRIPTION OF THE DRAWINGS

The various embodiments will hereinafter be described in conjunction with the following drawing figures, which are not necessarily drawn to scale, wherein like numerals denote like elements, and wherein:

FIGS. 3-13 illustrate, in cross section, exemplary methods for fabricating a protection device structure suitable for use with the electronic device of FIG. 1 in accordance with one embodiment of the invention;

DETAILED DESCRIPTION

Figure 1:
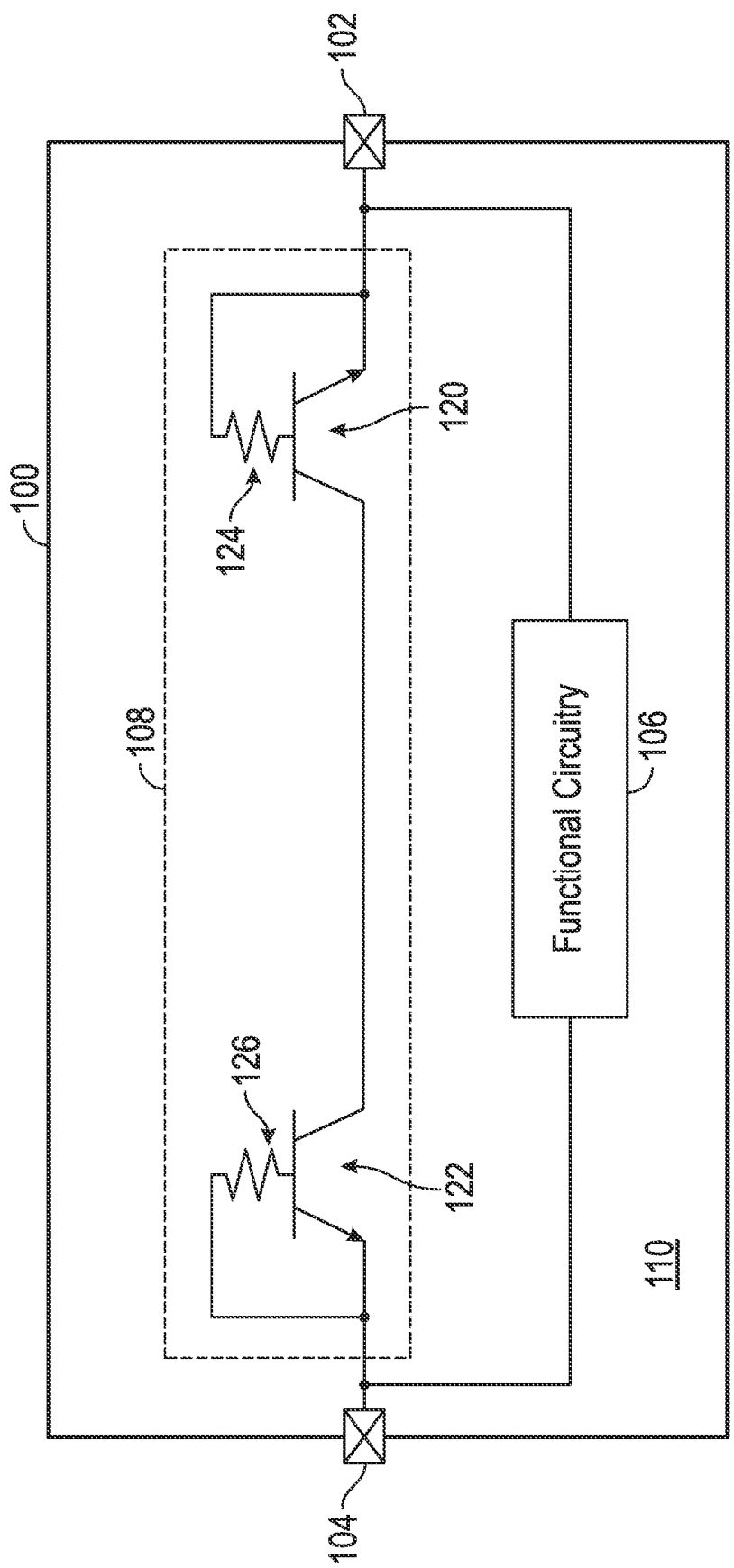
FIG. 1 is a schematic diagram of an exemplary electronic device in accordance with one embodiment of the invention.

Embodiments of the subject matter described herein relate to electrostatic discharge (ESD) protection devices and related circuitry having a reduced voltage differential between the transient triggering voltage and steady state breakdown voltage of the ESD clamping circuit, as well as a reduced voltage differential between the transient triggering voltage and the holding (or snapback) voltage of the ESD clamping circuit. As described in greater detail below, the ESD clamping circuit includes a bipolar junction transistor (BJT) having an increased intrinsic resistance associated with its base electrode, which, in turn, causes the base-emitter junction to be forward-biased at a lower transient voltage during an ESD event. As used herein, "intrinsic base resistance" should be understood as referring to a resistance that is formed, fabricated, or otherwise provided within a region or portion of a semiconductor substrate corresponding to a BJT as opposed to an external resistive element that may be coupled or otherwise connected to the base electrode of a BJT. In this regard, the BJT includes a relatively higher doped (or higher conductivity) base electrode well region that encompasses or otherwise surrounds the emitter electrode region, wherein a relatively lighter doped (or higher resistivity) base electrode well region is provided between the higher conductivity base electrode well region and the base electrode contact region that is electrically connected (or short-circuited) to the emitter electrode region. By virtue of the increased intrinsic base resistance provided by the higher resistivity base electrode well region between the higher conductivity base electrode well region and the base electrode contact region, the voltage differential between the base electrode contact region and the higher conductivity base electrode well region increases during an ESD event. As a result, base-emitter junction is forward-biased at a lower voltage for the higher conductivity base electrode well region, which, in turn, reduces the transient triggering voltage for the BJT while the steady state breakdown voltage for the BJT is maintained, thereby reducing the voltage differential between the transient triggering voltage and the steady state breakdown voltage. Accordingly, in some embodiments, when the ESD protection device is fabricated on a silicon-on-insulator (SOI) substrate and stacked or otherwise cascoded to achieve higher triggering voltages, the ESD protection circuit provides more flexibility for circuit designers by accommodating narrower design windows.

As described in greater detail below in the context of FIGS. 8-13, in exemplary embodiments, the BJT also includes a doped triggering base electrode well region provided between the higher conductivity base electrode well region and a collector region of the opposite conductivity type, thereby allowing the breakdown voltages of the BJT to be tuned by varying the dopant concentration of the triggering base well region and/or the distance between the triggering base well region and the collector region. In this manner, the triggering base well region allows for a relatively wide range of breakdown voltages over a relatively wide range of distance (or spacing) between the triggering base well region and the collector region. For example, in one embodiment, the triggering base well region accommodates a range of steady state breakdown voltages at 10 microamperes from about 19 Volts (V) to about 55 V for a corresponding range of separation distances of 0 micrometers (or microns) to 3.5 microns, resulting in a sensitivity of about 10 V/µm. Thus, the breakdown voltage may be relatively finely tuned over a relatively wide range of separation distances.

In exemplary embodiments, the dopant concentration of the triggering base well region is greater than the dopant concentration of the lower conductivity base electrode well region but less than the dopant concentration of the higher conductivity base electrode well region. The heavier doping of the higher conductivity base electrode well region relative to the lower conductivity and triggering base well regions reduces the current gain (β) of the BJT and increases the holding voltage of the BJT without increasing the footprint of the BJT. In this regard, further increasing the dopant concentration of the higher conductivity base electrode well region further increases the holding voltage of the BJT without increasing the footprint of the BJT or appreciably decreasing the damage onset threshold current. At the same time, the lower conductivity base well region may be tuned to achieve a desirably small voltage differential between the transient triggering voltage and steady state breakdown voltage and the triggering base well region may be tuned to achieve a desired breakdown voltage. In this regard, further decreasing the dopant concentration of the lower conductivity base electrode well region further decreases the voltage difference between the transient triggering voltage and steady state breakdown voltage, while varying the dopant concentration of the triggering base well region varies the adjustable range of transient triggering voltages. For example, decreasing the dopant concentration of the triggering base well region increases the transient triggering voltage for the minimum spacing between the triggering base well region and the collector region, while increasing the dopant concentration of the triggering base well region decreases the transient triggering voltage for the maximum spacing between the triggering base well region and the collector region. Thus, providing a dopant concentration of the triggering base well region that is less than the higher conductivity base electrode well region but greater than the lower conductivity base electrode well region may achieve the widest adjustable range of transient triggering voltages from the minimum spacing to the maximum spacing. Accordingly, the ESD protection device structures described herein accommodate a relatively finely tuned breakdown voltage (e.g., the transient triggering voltage ($V_{T1}$) and/or the steady state (or DC) breakdown voltage ($V_{TDC}$)) over a relatively wide range of separation distances, while at the same time achieving a reduced voltage differential between the transient triggering voltage ($V_{T1}$) and steady state breakdown voltage ($V_{TDC}$) and achieving a reduced voltage differential between the transient triggering voltage ($V_{T1}$) and the holding voltage ($V_H$) by virtue of increasing the holding voltage (e.g., by reducing the current gain (β)).

Turning now to FIG. 1, an exemplary electronic device package 100 includes one or more package interfaces 102, 104, functional circuitry 106 coupled to the package interfaces 102, 104, and protection circuitry 108 coupled to the interfaces 102, 104. In exemplary embodiments, the functional circuitry 106 and the protection circuitry 108 are formed, fabricated, mounted, or otherwise provided on a substrate 110 and encapsulated in a common device package to obtain the electronic device 100. In this regard, in some embodiments, the substrate 110 may be realized as a common semiconductor substrate having both the functional circuitry 106 and the protection circuitry 108 fabricated thereon, while in other embodiments, the substrate 110 may be realized as a package substrate (e.g., a lead frame, circuit board, or the like) that the functional circuitry 106 and the protection circuitry 108 are soldered, affixed, or otherwise mounted to. It should be understood that FIG. 1 is a simplified representation of the electronic device 100 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner.

The package interfaces 102, 104 generally represent the physical input/output interfaces to/from the functional circuitry 106 encapsulated in the electronic device 100. Depending on the embodiment, each of the package interfaces 102, 104 may be realized as an individual pin, pad, lead, terminal, solder ball, or another suitable physical interface to the electronic device 100. In accordance with one or more embodiments, the design (or intended) voltage for the first package interface 102 is greater than the design voltage for the second package interface 104. For example, the first package interface 102 may be realized as a positive reference (or supply) voltage input to the electronic device 100 and the second package interface 104 is realized as a negative reference (or ground) voltage input to the electronic device 100. Accordingly, for purposes of explanation, but without limitation, the first package interface 102 may alternatively be referred to herein as the higher voltage terminal, the positive reference voltage terminal, the supply voltage terminal, or the like, while the second package interface 104 may alternatively be referred to herein as the lower voltage terminal, the negative reference voltage terminal, the ground voltage terminal, or the like.

The functional circuitry 106 generally represents the components of the electronic device 100 configured to provide the desired functionality for the electronic device 100. In this regard, depending on the embodiment, the functional circuitry 106 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide the desired functionality for the electronic device 100. In an exemplary embodiment, the functional circuitry 106 is coupled to the package interfaces 102, 104 to receive a supply voltage, design voltage, or another operating voltage that facilitates the desired operation of the functional circuitry 106.

Still referring to FIG. 1, the protection circuitry 108 is connected electrically between the higher voltage terminal 102 and the lower voltage terminal 104 and configured electrically parallel to the functional circuitry 106 to protect the functional circuitry 106 from a transient voltage difference between the device terminals 102, 104 that exceeds a breakdown voltage ($V_B$) of the functional circuitry 106. In the illustrated embodiment, the protection circuitry 108 functions as an ESD voltage clamp that begins conducting current when the transient voltage difference between the device terminals 102, 104 exceeds a transient triggering voltage ($V_{T1}$) of the protection circuitry 108. In this regard, both the steady state (or DC) breakdown voltage ($V_{TDC}$) and transient triggering voltage ($V_{T1}$) of the protection circuitry 108 are chosen to be greater than the supply (or operating) voltage ($V_O$) of the functional circuitry 106 but less than the breakdown voltage ($V_B$) of the functional circuitry 106. In this manner, the protection circuitry 108 conducts current when the voltage difference between the terminals 102, 104 exceeds a ESD triggering voltage (i.e., the DC breakdown voltage ($V_{TDC}$) or the transient triggering voltage ($V_{T1}$)) and thereby clamps the voltage difference that the functional circuitry 106 is exposed to. Thus, the likelihood of the functional circuitry 106 being exposed to a voltage difference that exceeds the breakdown voltage ($V_B$) of the functional circuitry 106 during an ESD event is reduced.

Figure 2:
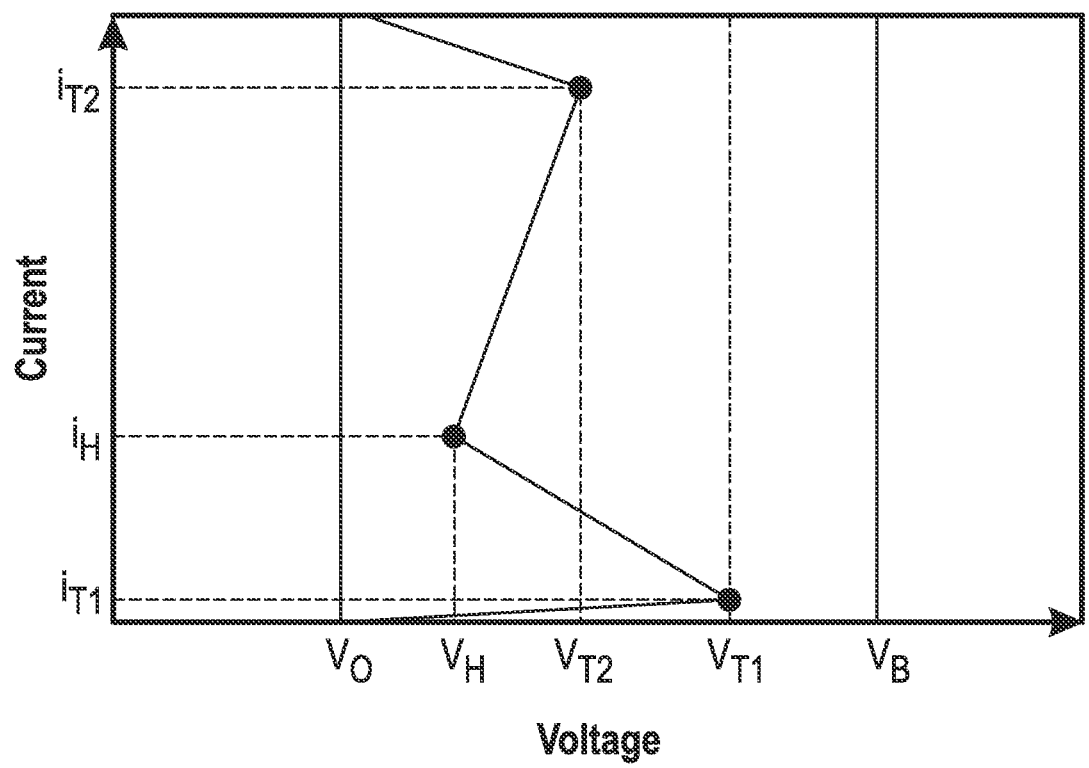
FIG. 2 is a graph depicting the relationship between transmission line pulse current and voltage for the protection circuitry in the electronic device of FIG. 1 in accordance with one embodiment.

FIG. 2 illustrates a graph of a transmission line pulse current versus voltage for a typical ESD protection circuit, such as, for example, the protection circuitry 108 of FIG. 1. Referring to FIGS. 1-2, as voltage applied to the device terminals 102, 104 is increased, very little current flows through the protection circuitry 108 until the transient triggering voltage ($V_{T1}$) of the protection circuitry 108 is reached, at which point avalanche breakdown in the BJT 122 occurs and the protection circuitry 108 begins conducting an ESD discharge current. The current through the protection circuitry 108 increases from a triggering current ($i_{T1}$) at the transient triggering point to a holding current ($i_H$) at a holding (or snapback) voltage ($V_H$). If the applied ESD voltage (or current) increases, the discharge current through the protection circuitry 108 increases until reaching a thermal breakdown current ($i_{T2}$) at voltage ($V_{T2}$), at which point functionality of the protection circuitry 108 may be irreversibly impaired. This current ($i_{T2}$) may alternatively be referred to as the damage onset threshold current. It should be noted that, in practice, the DC breakdown voltage ($V_{TDC}$) of the protection circuitry 108 is typically less than the transient triggering voltage ($V_{T1}$). Conversely, if the applied ESD voltage decreases below the holding voltage, the protection circuitry 108 stops conducting current when the applied voltage falls below that voltage. In this regard, when the difference between the triggering voltage and the holding voltage (e.g., $V_{T1}-V_H$) is relatively small, the protection circuitry 108 is effectively a non-snapback ESD clamp or otherwise exhibits non-snapback behavior, because the ESD clamp effectively stops conducting current when the applied voltage falls below the triggering voltage. For example, when the holding voltage ($V_H$) is greater than the design voltage for the functional circuitry 106, the protection device 108 stops conducting current once the applied voltage returns to the design voltage without any power cycling.

Referring again to FIG. 1, in exemplary embodiments, the protection circuitry 108 includes a pair of bipolar junction transistor (BJT) elements 120, 122 configured to provide an ESD voltage clamp. As illustrated, a first NPN bipolar transistor element 120 has an emitter electrode coupled to the higher voltage terminal 102, a base electrode electrically connected directly to the emitter electrode (e.g., short-circuited or via a negligible series impedance) and coupled to the higher voltage terminal 102, and a collector electrode coupled to the collector electrode of the second NPN bipolar transistor element 122. As described in greater detail below, in exemplary embodiments, the collector electrodes of the bipolar transistor elements 120, 122 are realized using a common doped region, that is, the bipolar transistor elements 120, 122 share a common collector electrode region formed in a semiconductor substrate. The emitter electrode of the second bipolar transistor element 122 is coupled to the lower voltage terminal 104 and the base electrode of the second bipolar transistor element 122 is electrically connected (or short-circuited) to the emitter electrode and coupled to the lower voltage terminal 104. The common collector electrodes of the bipolar transistor elements 120, 122 provide a parasitic bipolar junction transistor element configured between the base regions of the bipolar transistor elements 120, 122.

The protection circuitry 108 is bidirectional and capable of conducting current in either direction between terminals 102, 104 to clamp voltages between terminals 102, 104 from ESD events with either polarity. In other words, the protection circuitry 108 conducts current from the higher voltage terminal 102 to the lower voltage terminal 104 when the voltage at the higher voltage terminal 102 exceeds the voltage at the lower voltage terminal 104 by more than a first triggering voltage and conducts current from the lower voltage terminal 104 to the higher voltage terminal 102 when the voltage at the lower voltage terminal 104 exceeds the voltage at the higher voltage terminal 102 by more than a second triggering voltage. For purposes of explanation, the triggering voltage differential for conducting current from the higher voltage terminal 102 to the lower voltage terminal 104 may alternatively be referred to herein as the forward triggering voltage and the triggering voltage differential for conducting current from the lower voltage terminal 104 to the higher voltage terminal 102 may alternatively be referred to herein as the reverse triggering voltage.

Figure 15:
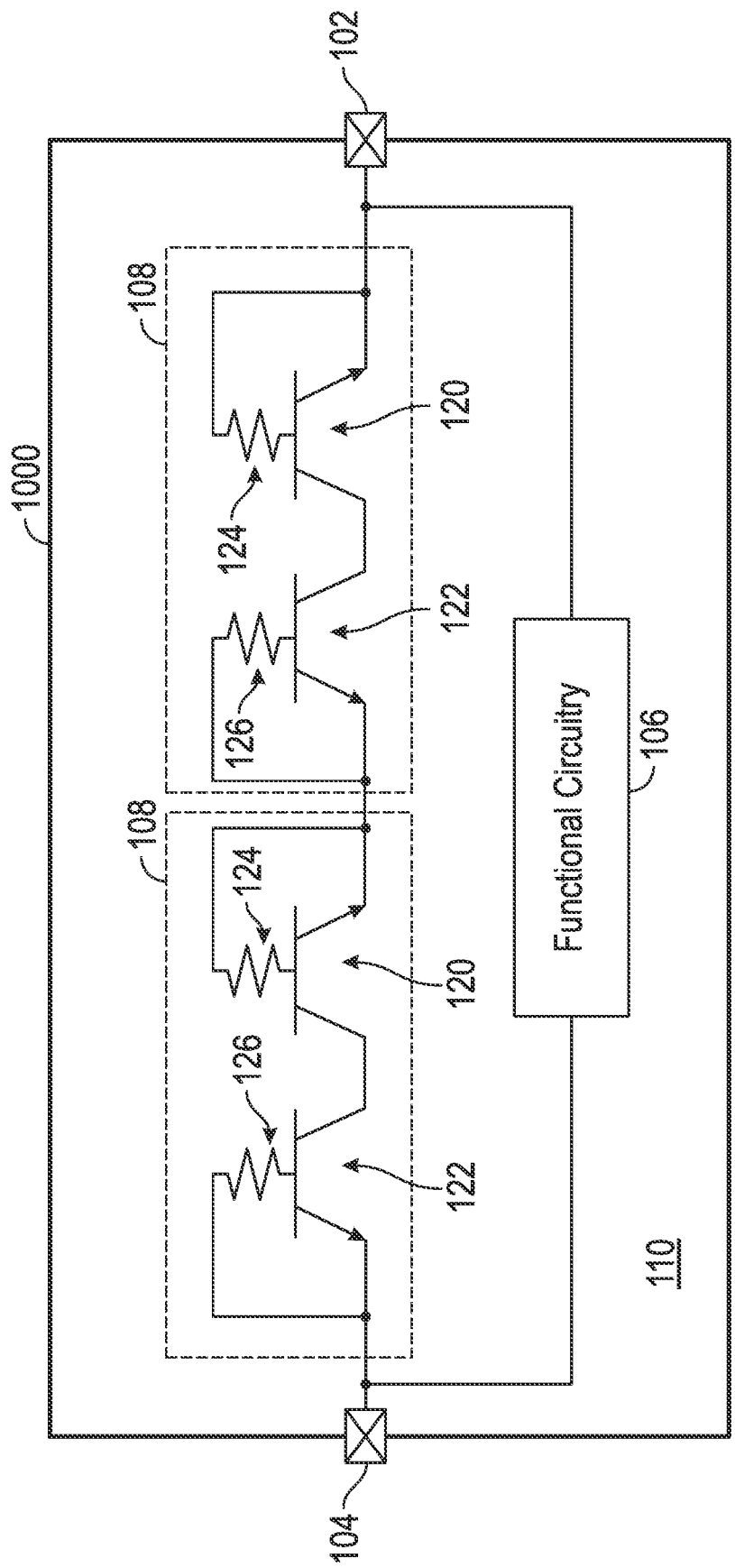
FIG. 15 is a schematic diagram of an electronic device having stacked protection circuitry in accordance with one embodiment of the invention.

Still referring to FIG. 1 and with reference to FIG. 15, in some embodiments, multiple instances of the protection circuitry 108 are stacked or cascoded electrically in series between the device terminals 102, 104 to achieve greater triggering voltages. For example, the packaged electronic device 1000 depicted in FIG. 15 utilizes two instances of the protection circuitry 108 that are configured electrically in series otherwise cascoded between the device terminals 102, 104 (e.g., by providing an electrical connection from the emitter of BJT 122 of one instance of protection circuitry 108 to the emitter of BJT 120 of another instance of protection circuitry) to achieve a triggering voltage that is greater than the triggering voltage achievable by a singular instance of protection circuitry 108. In exemplary embodiments, the substrate 110 of the packaged electronic device 1000 including stacked protection circuitry 108 is realized as a SOI substrate that provides vertical isolation, which, in turn, allows the stacked instances of the protection circuitry 108 to be formed or otherwise provided on the substrate 110 adjacent to or otherwise proximate one another as illustrated in FIG. 15. In this regard, the vertical isolation provided by the SOI substrate combined with lateral isolation (e.g., deep trench isolation) between instances of the protection circuitry 108 prevents the substrate voltage underlying one instance of the protection circuitry 108 from influencing the breakdown of an adjacent instance of the protection circuitry 108. In alternative embodiments, instances of the protection circuitry 108 may be stacked when fabricated on a bulk substrate by providing an appropriate doping profile that isolates the protection circuitry 108 from the surrounding bulk substrate (e.g., by using N-type well regions and buried regions to provide isolation from a P-type bulk substrate).

As described in greater detail below, each of the bipolar transistor elements 120, 122 may include an increased intrinsic base resistance 124, 126 that is configured to reduce the transient voltage required to forward bias the base-emitter junction of the respective bipolar transistor element 120, 122 after avalanche breakdown, which, in turn, reduces the transient triggering voltage ($V_{T1}$) of the protection circuitry 108. At the same time, the increased base resistance 124, 126 does not reduce the DC breakdown voltage ($V_{TDC}$) of the protection circuitry 108. Accordingly, the difference between the transient triggering voltage ($V_{T1}$) and the DC breakdown voltage ($V_{TDC}$) is reduced, thereby allowing the protection circuitry 108 to accommodate narrower design windows (e.g., functional circuitry 106 having a reduced difference between the breakdown voltage ($V_B$) and the supply voltage ($V_O$)).

FIGS. 3-13 illustrate, in cross-section, a protection device structure 300 suitable for use as the protection circuitry 108 in the electronic device 100 of FIG. 1 in accordance with one or more exemplary embodiments. Various steps in the manufacture of semiconductor devices are well known and so, in the interest of brevity, many conventional steps will only be mentioned briefly herein or will be omitted entirely without providing the well-known process details. Furthermore, it should be appreciated that although the subject matter may be described herein in the context of NPN bipolar junction transistor elements, the subject matter is not intended to be limited to NPN bipolar junction transistor elements and may be implemented in an equivalent manner for PNP bipolar junction transistor elements (e.g., by interchanging the conductivities of the doped regions).

Figure 13:
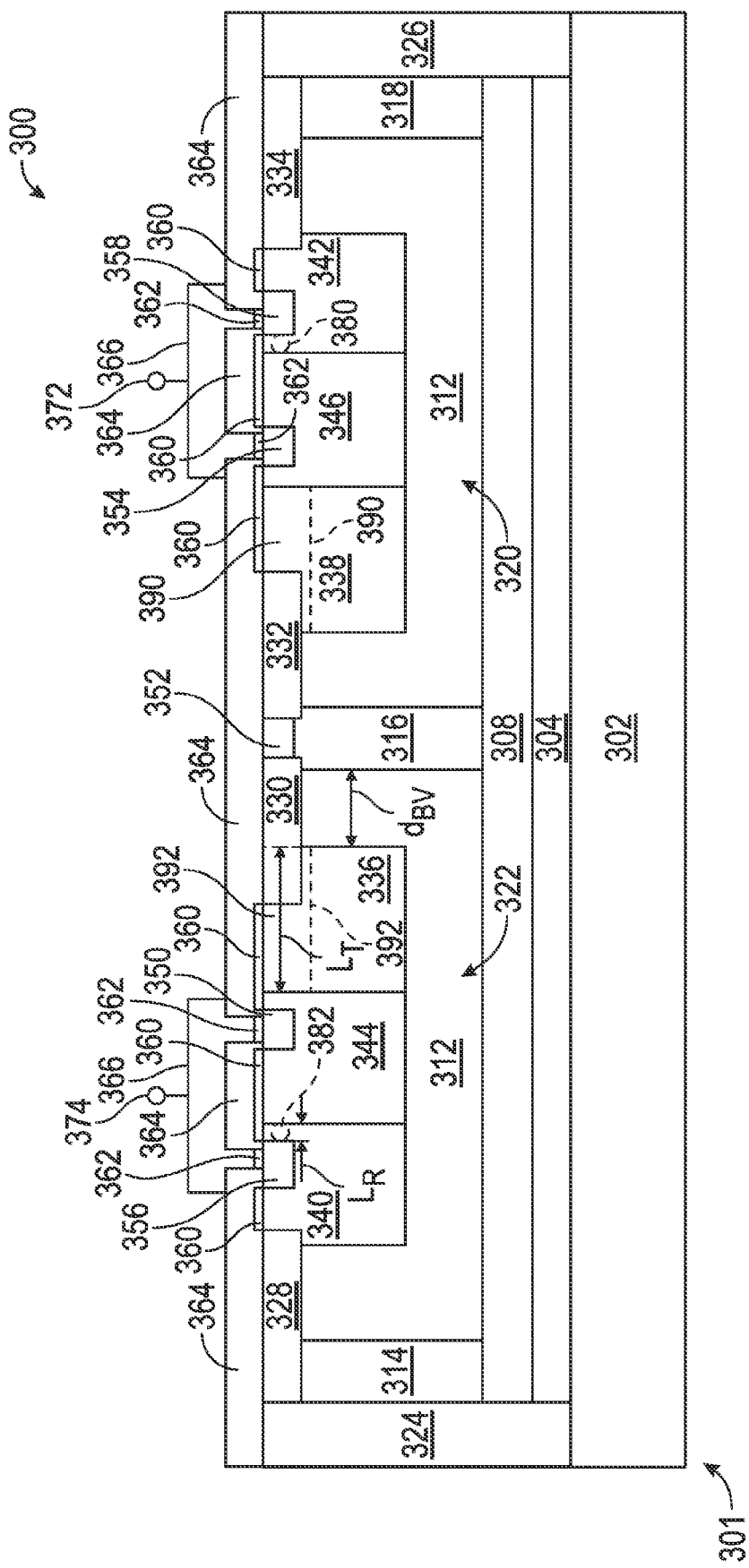

As best illustrated in FIG. 13, and with reference to FIG. 1, in exemplary embodiments, the protection circuitry 108 is realized as the protection device structure 300, which includes a pair of transistor regions 320, 322 having electrodes of the BJTs 120, 122 formed therein. In this regard, a first physical interface 372 is realized as the higher voltage terminal 102 and a second physical interface 374 is realized as the lower voltage terminal 104, wherein the first BJT 120 is comprised of emitter region 354, base regions 338, 342, 346, 358, and collector regions 308, 316 and second BJT 122 is comprised of emitter region 350, base regions 336, 340, 344, 356, and collector regions 308, 316. As described above, in exemplary embodiments, the protection device structure 300 is fabricated on a SOI substrate 301 that provides vertical isolation that allows multiple instances of the protection device structure 300 to be stacked or cascoded and connected in series to achieve the desired triggering voltage and/or holding voltage required by the particular functional circuitry 106 of interest.

Still referring to FIG. 13, to achieve the increased base resistance 124, 126, the base electrode contact region 356, 358 of a respective BJT 120, 122 is spaced apart from a higher conductivity (or lower resistivity) base well region 344, 346 of that BJT 120, 122 so that at least a portion 380, 382 of a lower conductivity (or higher resistivity) base well region 340, 342 is provided between the respective base electrode contact region 356, 358 and the higher conductivity base well region 344, 346. For example, for the BJT 122 formed in region 322, the emitter electrode contact region 350 is formed within a first well region 344 of the base electrode that has a relatively higher conductivity (or lower resistivity) than a second well region 340 that has the base electrode contact region 356 formed therein. The intervening portion 382 of the lower conductivity well region 340 residing between the base electrode contact region 356 and the higher conductivity well region 344 and/or emitter electrode contact region 350 provides an increased base resistance 126 between the base electrode contact region 356 and the higher conductivity base well region 344 and/or emitter electrode contact region 350. Similarly, for the BJT 120 on region 320, the portion 380 of the lower conductivity well region 342 residing between the base electrode contact region 358 and the higher conductivity well region 346 and/or emitter electrode contact region 354 provides an increased base resistance 124 between the base electrode contact region 358 and the base well region 346 and/or emitter electrode contact region 354. As described in greater detail below, to achieve increased holding voltage, the well region 344, 346 surrounding the emitter region 350, 354 is the most highly doped (or highest conductivity) well region of the respective BJT 120, 122 to reduce the current gain ($\beta$) of the respective BJT 120, 122. Accordingly, the most highly doped well regions 344, 346 are alternatively referred to herein as the current gain control well regions 344, 346, while the lighter doped well regions 340, 342 are alternatively referred to herein as the resistive well regions 340, 342.

To achieve a desired breakdown voltage, triggering well regions 336, 338 having a lower conductivity (or higher resistivity) than the current gain control well regions 344, 346 but a higher conductivity (or lower resistivity) than the resistive well regions 340, 342 are provided between the respective current gain control well regions 344, 346 and the collector regions 308, 316. As described in greater detail below, the triggering well regions 336, 338 are spaced apart from the collector region 316 by a distance that defines the breakdown voltage of the respective BJTs 120, 122. Additionally, the intervening portion of a respective triggering well region 336, 338 between the collector region 316 and the respective current gain control well region 336, 338 helps define the holding voltage of the respective BJT 120, 122. For example, for the BJT 122 in region 322, the length ($L_T$) of the intervening portion 390 of the triggering well region 336 residing between the current gain control well region 344 and/or emitter electrode contact region 350 provides a reduced lateral current gain.

During an ESD event when a higher transient voltage is applied at terminal 102, 372 relative to terminal 104, 374, the base-collector junction of the first BJT 120 (e.g., between base regions 338, 342, 346, 358 and common collector regions 308, 316) is forward-biased, thereby raising the electrical potential of the common collector region 308, 316. The collector potential increases until the avalanche breakdown occurs across the collector-base junction of the second BJT 122. The carriers generated by the breakdown flow between the base electrode contact region 356 and the current gain control base well region 344 and/or emitter electrode contact region 350 through the base resistance 126 provided by the portion 382 of the resistive base well region 340 residing between the base electrode contact region 356 and the gain control base well region 344 and/or emitter electrode contact region 350. As a result, by virtue of the base electrode contact region 356 being electrically connected to the emitter electrode contact region 350 (and thereby at the same electrical potential of the emitter electrode contact region 350), the base resistance 126 provided by the intervening portion 382 of the higher resistivity base well region 340 increases the electrical potential (or voltage) of the higher conductivity base well region 344 relative to the emitter electrode contact region 350 to forward-bias the base-emitter junction. Accordingly, the increased base resistance 126 provided by the portion 382 of the higher resistivity base well region 340 lowers the transient triggering voltage of the BJT 122, and thereby lowers the transient triggering voltage ($V_{T1}$) of the protection circuitry 108 and/or protection device structure 300. Increasing the length of the intervening portion 382 of the higher resistivity base well region 340 ($L_R$) residing between the base electrode contact region 356 and the lateral boundary of the higher conductivity base well region 344 (or alternatively, increasing the distance between the base electrode contact region 356 and the lateral boundary of the higher conductivity base well region 344) further increases the base resistance 126, which, in turn, further reduces the transient triggering voltage ($V_{T1}$).

It should be noted that the steady state (or DC) avalanche breakdown voltage of the collector-base junction of the BJT 122 is dictated by the distance ($d_{BV}$) between the triggering base well region 336 and the collector well region 316 (or alternatively, the length of the portion of the lower conductivity epitaxial layer 312 residing between the triggering base well region 336 and the collector well region 316). Accordingly, the added base resistance 126 attributable to the higher resistivity base well region 340 reduces the transient triggering voltage without impacting the DC avalanche breakdown voltage of the BJT 122. Accordingly, by virtue of the added base resistance 126, the forward transient triggering voltage ($V_{T1}$) of the protection circuitry 108 and/or protection device structure 300 may be reduced without decreasing the forward DC breakdown voltage ($V_{TDC}$) of the protection circuitry 108 and/or protection device structure 300. As a result, the difference ($\Delta V_{T1}$) between the forward transient triggering voltage ($V_{T1}$) and the forward DC breakdown voltage ($V_{TDC}$) for the protection circuitry 108 and/or protection device structure 300 and is capable of fitting in narrower design windows.

Similarly, the distance ($d_{BV}$) between the lateral boundary of the triggering base well region 336 and the collector region 316 may be varied to increase and/or decrease the forward DC breakdown voltage ($V_{TDC}$) of the BJT 122. For example, in one embodiment, a distance $d_{BV}$=0 results in a forward DC breakdown voltage ($V_{TDC}$) of about 19 V while a distance $d_{BV}$=3.5 microns results in a forward DC breakdown voltage ($V_{TDC}$) of about 55 V. In this regard, increasing the separation distance ($d_{BV}$) increases the breakdown voltages of the BJT 122, while decreasing the separation distance ($d_{BV}$) decreases the breakdown voltages of the BJT 122. Additionally, the length ($L_T$) of the intervening portion 392 of the triggering base well region 336 that resides between the gain control base well region 344 and/or the emitter region 350 and the collector region 316 and/or the lateral boundary with the epitaxial layer 312 decreases the current gain ($\beta$) and increases the holding voltage ($V_H$). In this regard, increasing the length ($L_T$) of the intervening portion 392 increases the holding voltage ($V_H$), and conversely, decreasing the length ($L_T$) of the intervening portion 392 decreases the holding voltage ($V_H$). In this regard, the length ($L_T$) of the intervening portion 392 may be chosen to offset or otherwise compensate for decreases in holding voltage ($V_H$) that would otherwise be attributable to the increased base resistance provided by the intervening portion 382. In exemplary embodiments, the current gain control base well region 344 may also be more heavily doped to further decrease the current gain ($\beta$) and increase the holding voltage ($V_H$) without increasing the area footprint of the BJT 122.

In a similar manner, the length of intervening portion 380 of the resistive well region 342 and/or the length of the intervening portion 390 of the triggering well region 338 of the first BJT 120 may also be varied to achieve a desired reduction in the transient triggering voltage difference along with a desired holding voltage ($V_H$). In other words, the length of intervening portion 382 and/or the length of intervening portion 392 may be different from the length of intervening portion 380 and/or the length of intervening portion 390. Additionally, the separation distance between the triggering well region 338 of the first BJT 120 and the collector region 316 may also be chosen to provide a desired reverse DC breakdown voltage.

Referring now to FIG. 3, in exemplary embodiments, the protection device structure 300 is fabricated on a semiconductor substrate, such as a SOI substrate 301 having a support (or handle) layer 302 of semiconductor material, an insulating layer 304 of dielectric material on or otherwise overlying the support layer 302, and a layer 306 of semiconductor material on or otherwise overlying the insulating layer 304. As described in greater detail below, in exemplary embodiments, the layer 306 of semiconductor material is utilized to epitaxially grow additional semiconductor material thereon, and accordingly, for convenience, but without limitation, the layer 306 of semiconductor material may alternatively be referred to herein as the seed layer. In an exemplary embodiment, the semiconductor material of each of the layers 302, 306 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 302, 306 may be realized as germanium, gallium arsenide, and the like, and/or one or more of the layers 302, 306 may include layers of different semiconductor materials. In accordance with one embodiment, the insulating layer 304 is realized as an oxide layer formed in a subsurface region of the semiconductor substrate 301, also known as a buried oxide (BOX) layer. For example, the insulating layer 304 may be formed by oxidizing a wafer of semiconductor material (e.g., layer 306) which is then bonded to the support layer 302 to provide a buried layer of oxide material between the support layer 302 and the seed layer 306.

In exemplary embodiments, the seed layer 306 is lightly doped. For example, the seed layer 306 may be realized as a P-type silicon material having a P-type dopant concentration in the range of about $1 \times 10^{15}$/cm$^3$ to about $8 \times 10^{15}$/cm$^3$. The support layer 302 may also be doped with the same (or different) conductivity-determining impurity type as the seed layer 306. In exemplary embodiments, the support layer 302 is realized as an N-type silicon material. It should be understood that the protection devices and the fabrication processes described herein are not constrained by the substrate of semiconductor material utilized, and the fabrication process described herein may also be used to create protection devices on a bulk semiconductor substrate.

Referring to FIG. 4, in exemplary embodiments, fabrication of the protection device structure 300 continues by masking peripheral portions of the protection device structure 300 and forming a doped region 308 of semiconductor material within the seed layer 306 having a conductivity type that is opposite the conductivity of the seed layer 306. The doped region 308 is formed by masking the protection device structure 300 with a masking material 309, such as a photoresist material, that is patterned to provide an implantation mask that exposes the interior portion of the seed layer 306 to be used for the doped region 308. The doped region 308 is then formed by implanting N-type ions, such as antimony ions or phosphorous ions, illustrated by arrows 310, in the seed layer 306 with a dopant concentration in the range of about $1 \times 10^{18}$/cm$^3$ to about $1 \times 10^{19}$/cm$^3$ at an energy level in the range of about 50 kiloelectron volts (keV) to about 2000 keV. In the illustrated embodiment, the depth of the doped region 308 (after subsequent thermal annealing or any other diffusion) corresponds to the thickness of the seed layer 306 so that the doped region 308 extends to and abuts or otherwise contacts the insulating layer 304. For example, in accordance with one or more embodiments, the thickness of the seed layer 306 is within the range of about 1 micrometer (or micron) to about 4 microns (depending on the needs of a particular application), and the doped region 308 has a depth in the range of 1 micron to about 4 microns that corresponds to the thickness of the seed layer 306. In one embodiment, the thickness of the seed layer 306 (and thereby the doped region 308) is around 2 microns.

Figure 5:
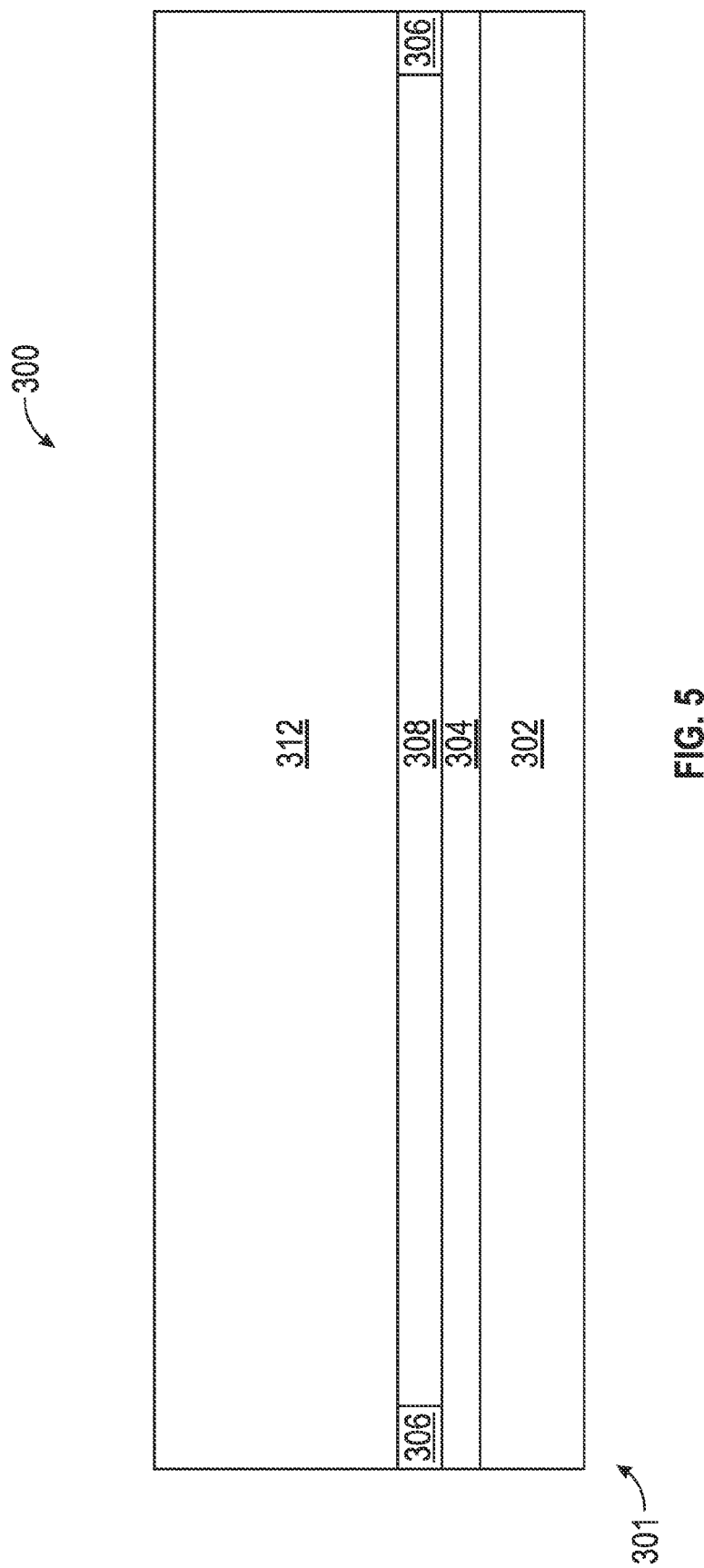

After forming the doped region 308, fabrication of the protection device structure 300 continues by removing the masking material 309 and forming or otherwise providing another doped region of semiconductor material that has a desired thickness overlying the doped region 308 and a conductivity type opposite the doped region 308, resulting in the protection device structure 300 illustrated in FIG. 5. For example, a P-type epitaxial layer 312 may be formed by epitaxially growing silicon material on the seed layer 306 and in-situ doping the silicon material by adding boron ions (or other P-type ions) to the reactants used to epitaxially grow the layer 312. In one or more embodiments, the epitaxial layer 312 has a P-type dopant concentration in the range of about $1\times10^{15}/cm^3$ to about $8\times10^{15}/cm^3$. In an exemplary embodiment, the epitaxial layer 312 is grown to a thickness in the range of about 3 microns to about 6 microns, which may vary depending on the needs of a particular application. It should be understood that the protection devices and the fabrication processes described herein are not constrained by the manner in which the doped region 308 and/or P-type layer 312 are formed, and the protection device structure 300 illustrated in FIG. 5 may be fabricated or otherwise achieved in a variety of alternative manners (e.g., the P-type layer 312 does not necessarily need to be realized as an epitaxial layer and does not necessarily need to be epitaxially grown and/or in-situ doped, the doped region 308 does not necessarily need to be formed by ion implantation, etc.). In alternative embodiments, the epitaxial layer 312 may have the same conductivity type (e.g., N-type) as the doped region 308. That said, for purposes of explanation and without limitation, the subject matter may be described herein in the context of a P-type epitaxial layer 312.

Figure 6:
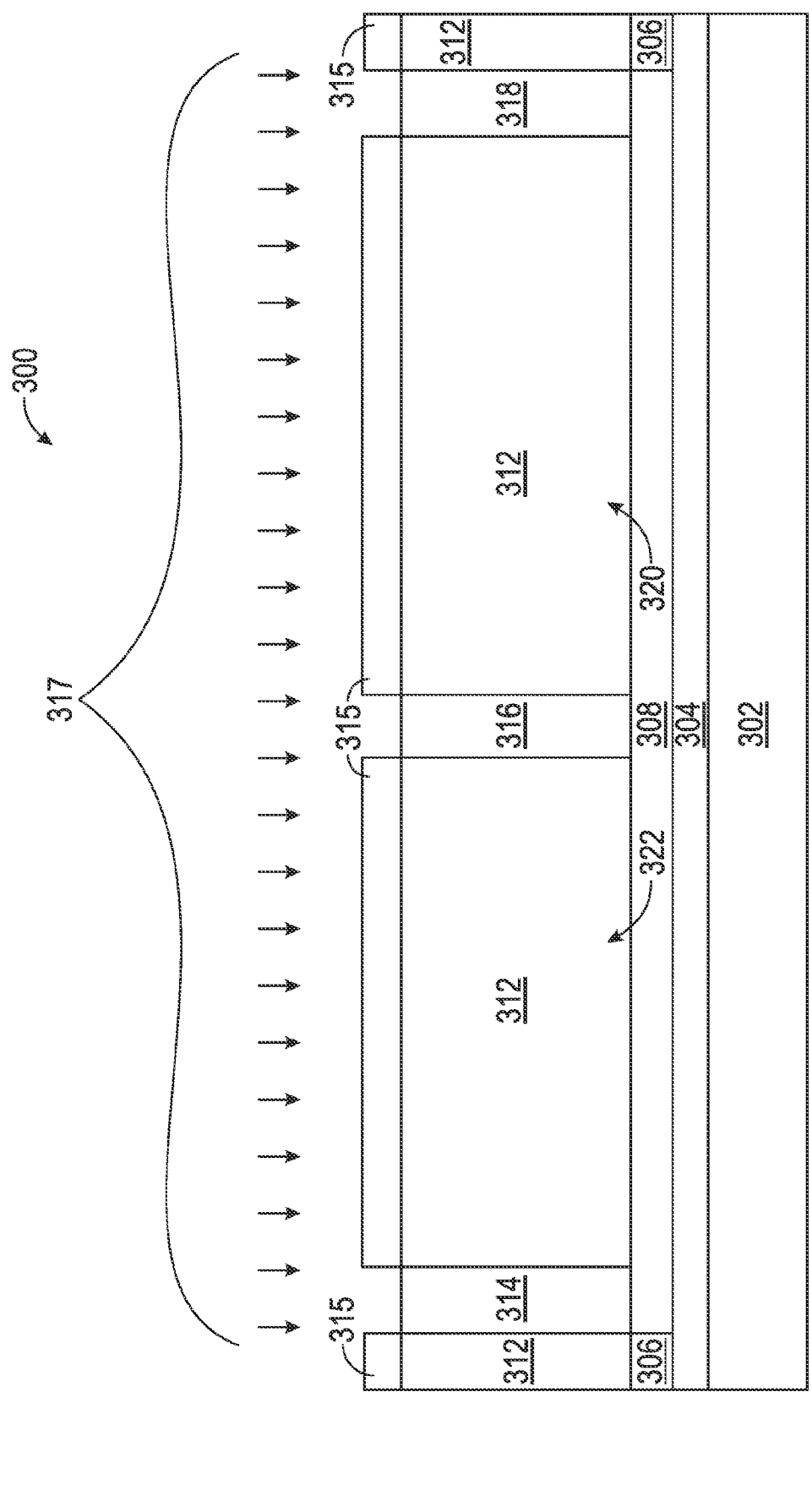

Turning now to FIG. 6, after forming the epitaxial layer 312, the fabrication process continues by masking portions of the epitaxial layer 312 and forming doped sinker regions 314, 316, 318 of semiconductor material having the opposite conductivity type within the epitaxial layer 312. The doped sinker regions 314, 316, 318 are formed by masking the protection device structure 300 with a masking material 315 that is patterned to provide an implantation mask that exposes an interior (or central) portion of the epitaxial layer 312 to be used for the interior doped sinker region 316 and peripheral portions of the epitaxial layer 312 to be used for peripheral doped sinker regions 314, 318 that abut subsequently formed deep trench isolation regions. For example, N-type sinker regions 314, 316, 318 are formed by implanting N-type ions, such as phosphorous ions or arsenic ions, illustrated by arrows 317, in the epitaxial layer 312 with a dopant concentration in the range of about $1\times10^{16}/cm^3$ to about $1\times10^{19}/cm^3$, and more preferably within the range of about $1\times10^{17}/cm^3$ to about $8\times10^{16}/cm^3$, at an energy level in the range of about 2000 keV to about 3000 keV to provide N-type sinker regions 314, 316, 318 with a depth (after subsequent thermal annealing or any other diffusion) corresponding to the thickness of the epitaxial layer 312 so that the N-type sinker regions 314, 316, 318 extend to and abut the N-type buried region 308, thereby electrically connecting the N-type sinker regions 314, 316, 318 to the N-type buried region 308. As illustrated, the N-type sinker regions 314, 316, 318 partition the P-type epitaxial layer 312 into separate P-type regions 320, 322 having a respective bipolar junction transistor element of the protection circuitry 108 fabricated therein. For example, BJT 120 may be fabricated in a first P-type region 320 and BJT 122 may be fabricated in the second P-type region 322, as described in greater detail below. Although not illustrated in FIGS. 6-13, in some embodiments, after forming the N-type sinker regions 314, 316, 318, N-type well regions may be formed either within the N-type sinker regions 314, 316, 318 or otherwise extending into and/or partially overlapping the N-type sinker regions 314, 316, 318. In this regard, an N-well region may extend laterally from a respective sinker region 314, 316, 318.

Figure 7:
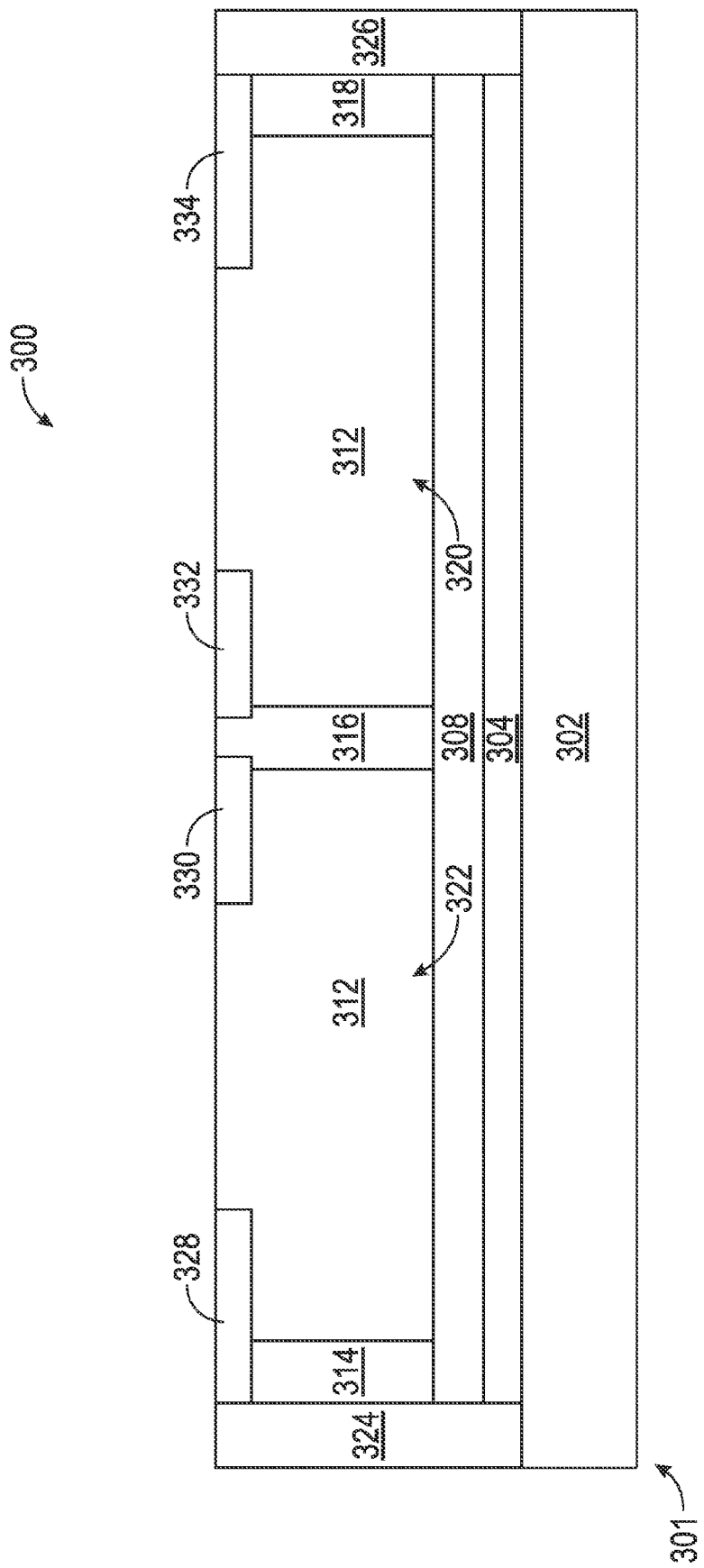

In the illustrated embodiment, after forming the N-type sinker regions 314, 316, 318, the fabrication process continues by forming isolation regions, resulting in the protection device structure 300 illustrated in FIG. 7. In an exemplary embodiment, the fabrication process isolates the protection circuitry from adjacent semiconductor devices by performing deep trench isolation (DTI) to provide deep isolation regions 324, 326 of dielectric material. For example, to form deep isolation regions 324, 326, the interior portion of the protection device structure 300 is masked with a masking material that is subsequently patterned to expose the peripheral portions of the epitaxial layer 312 and seed layer 306, which are then etched until the buried layer 304 is exposed, and thereafter, a dielectric material, such as an oxide material, may be deposited in the trenches or grown on exposed surfaces of the trenches to fill the trenches, resulting in deep isolation regions 324, 326.

Additionally, shallow isolation regions 328, 330, 332, 334 of a dielectric material are formed in the upper portions of the N-type sinker regions 314, 316, 318 and adjacent portions of P-type epitaxial regions 320, 322 by performing shallow trench isolation (STI). To form the shallow isolation regions 328, 330, 332, 334, portions of the epitaxial layer 312 are masked with a masking material that is patterned to expose the peripheral N-type sinker regions 314, 318, portions of the interior sinker region 316 adjacent to the epitaxial layer 312 (while leaving the central portion of the interior sinker region 316 masked), and portions of the P-type epitaxial regions 320, 322 adjacent to the N-type sinker regions 314, 316, 318 so that the shallow isolation regions 328, 330, 332, 334 are formed overlying portions of the epitaxial layer 312 adjacent to the N-type sinker regions 314, 316, 318. The exposed portions of the N-type sinker regions 314, 316, 318 and adjacent portions of the P-type epitaxial layer 312 are then etched to a desired depth (which is less than the thickness of the epitaxial layer 312), and a dielectric material, such as an oxide material, may be deposited to fill the trenches, resulting in shallow isolation regions 328, 330, 332, 334. In accordance with one or more exemplary embodiments, the depth of the shallow isolation regions 328, 330, 332, 334 is in the range of about 0.05 microns to about 1 micron, and more preferably, within the range of 0.2 microns to 0.5 microns. In the illustrated embodiment, the shallow isolation regions 328, 330, 332, 334 extend laterally beyond the boundaries of the N-type sinker regions 314, 316, 318.

Figure 8:
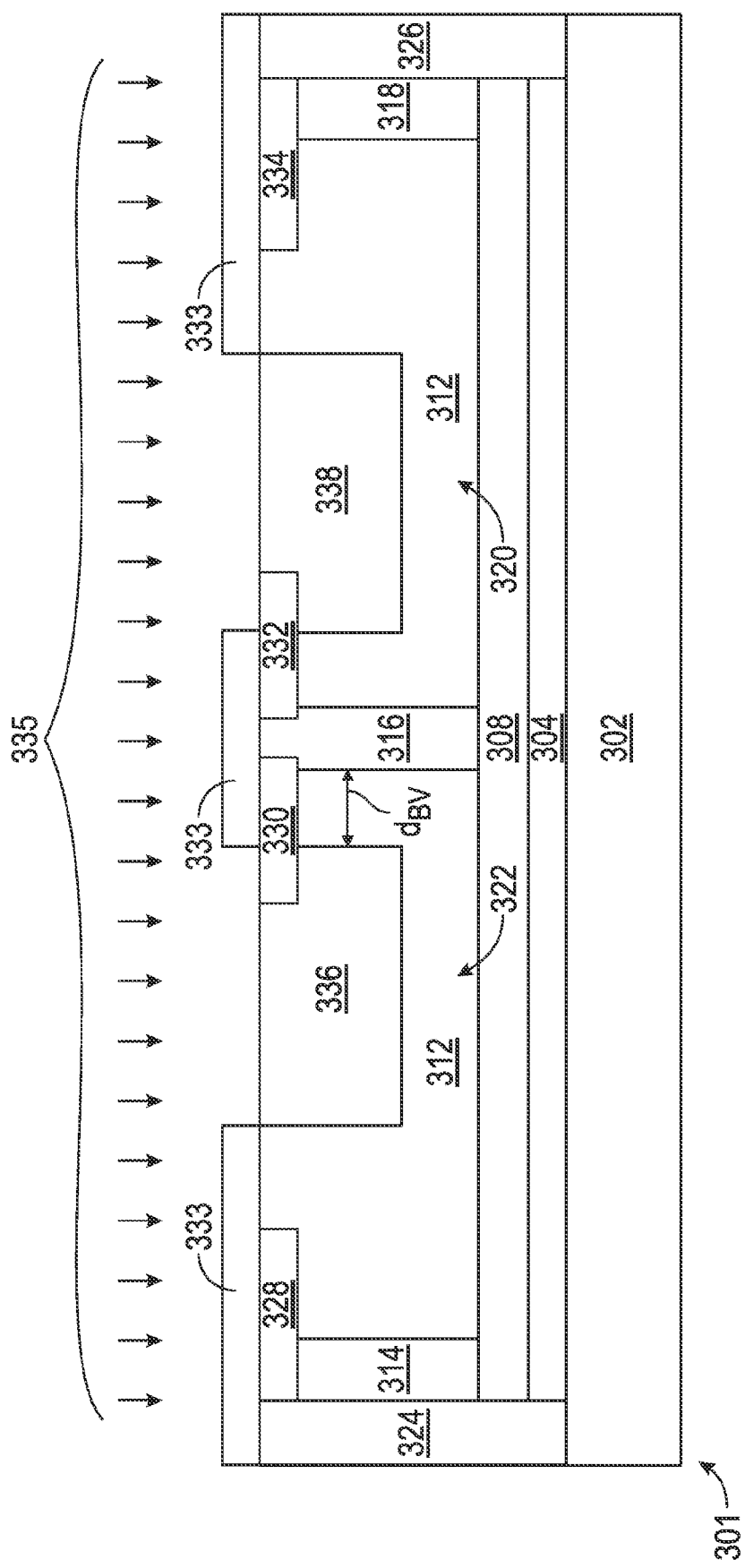
Figure 9:
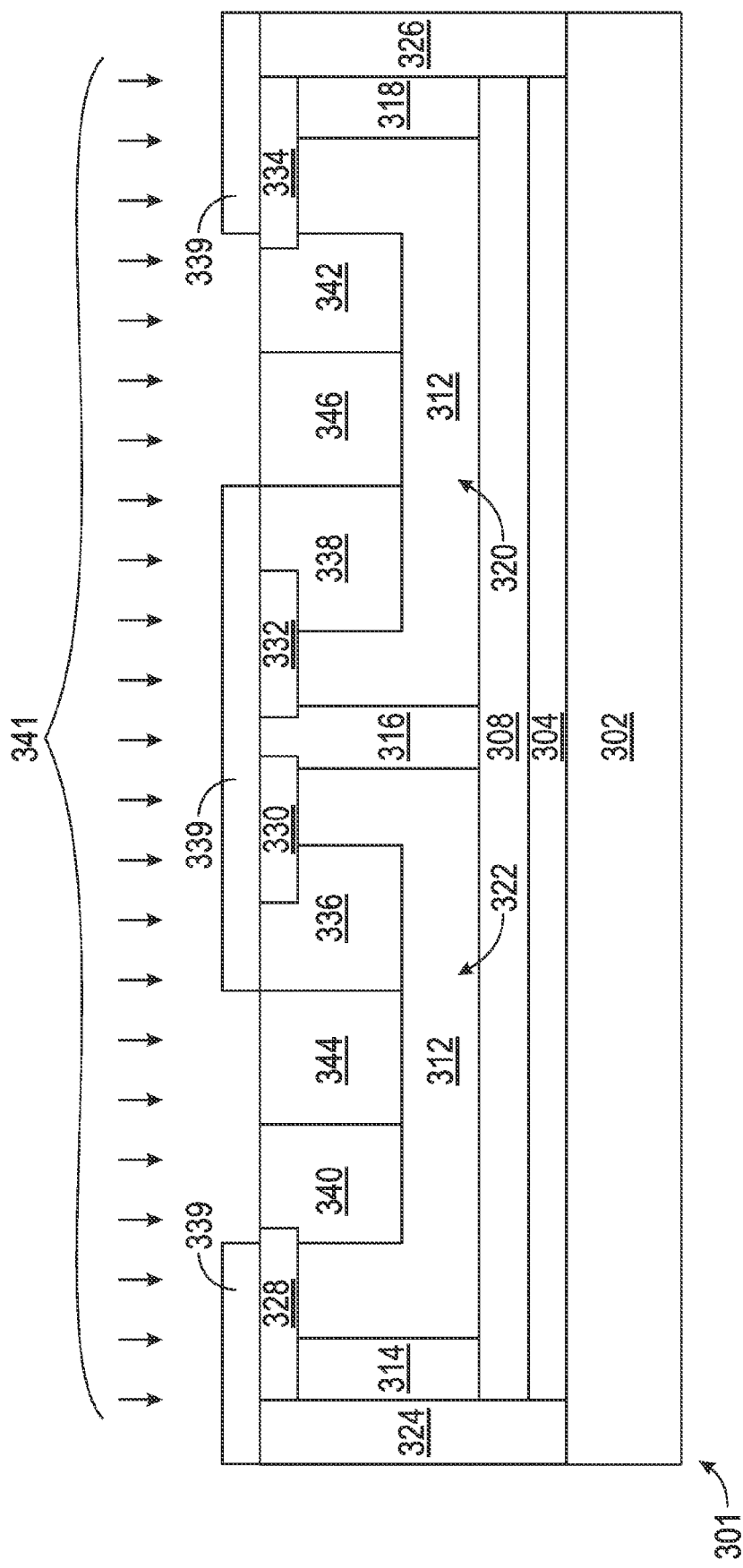
Figure 10:
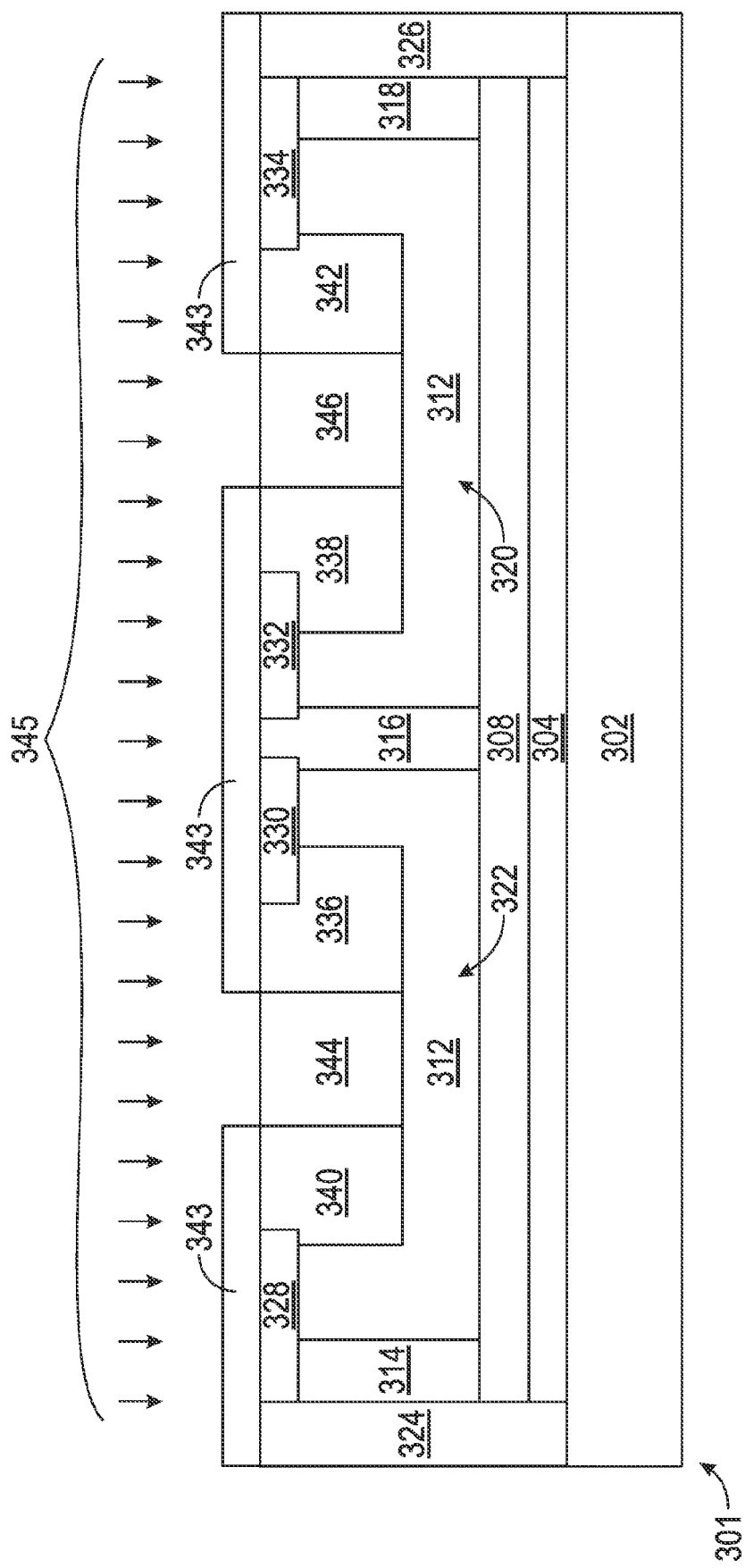

Turning now to FIGS. 8-10, fabrication of the protection device structure 300 continues by masking the N-sinker regions 314, 316, 318 and forming P-type well regions 336, 338, 340, 342, 344, 346 in the interior portions of the P-type epitaxial regions 320, 322. It should be noted that although FIGS. 8-9 depicts lighter doped (or higher resistivity) P-well regions 340, 342 that function as the resistive base well regions as being formed after higher doped (or higher conductivity) P-well regions 336, 338 that function as the triggering base well regions, in alternative embodiments, the resistive P-well regions 340, 342 may be formed prior to forming the triggering P-well regions 336, 338. In exemplary embodiments, the triggering P-well regions 336, 338 and the resistive P-well regions 340, 342 overlap in an interior portion of a respective P-type epitaxial region 320, 322, which is further doped to provide the highest doped P-well region 344, 346 having the respective emitter region formed therein. For purposes of explanation, the P-well regions 344, 346 having the emitter regions formed therein are alternatively referred to herein as the current gain control P-well regions.

Referring to FIG. 8, as described above, the first P-well regions 336, 338 function as a doped portion of the base electrode of a respective bipolar junction transistor element (e.g., bipolar junction transistor elements 120, 122) formed within the respective transistor regions 320, 322 that resides between the emitter electrode of that respective bipolar junction transistor element and the interior N-type sinker region 316. Thus, the portion of the relatively lighter doped epitaxial region 320, 322 residing between a lateral boundary of the interior N-type sinker region 316 and the adjacent lateral boundary of a respective triggering P-well region 336, 338 dictates the avalanche breakdown voltage across the collector-base junction (e.g., between collector well region 316 and a respective base well region 336, 338) before the resulting electrical potential of the base forward-biases the base-emitter junction and turns on or triggers a respective bipolar transistor element. In other words, the distance ($d_{BV}$) between a lateral boundary of the N-type region 318 and the proximal lateral boundary of the triggering P-well region 336 dictates the collector-to-base avalanche breakdown voltage that generates carriers and then turns on (or triggers) the BJT 122, and similarly, the distance between the opposite lateral boundary of the N-type region 318 and the adjacent lateral boundary of P-well region 338 dictates the collector-to-base avalanche breakdown voltage required to generates carriers and turns on (or-triggers) BJT 120. In the illustrated embodiment, the P-well regions 336, 338 are spaced apart from the collector well region 316 by a lateral separation distance, wherein at least a portion of a respective lighter doped P-type epitaxial region 320, 322 remains intact laterally between the lateral boundary of a respective P-well region 336, 338 formed therein and the proximal lateral boundary of the collector well region 316. In one or more exemplary embodiments, the lateral separation distance between a lateral boundary of a respective P-well region 336, 338 and the proximal lateral boundary of the collector well region 316 is less than ten microns. In some embodiments, a respective P-well region 336, 338 may abut the collector well region 316.

To fabricate P-well regions 336, 338, the protection device structure 300 is masked with a masking material 333 that is patterned to provide an implantation mask that exposes interior portions of the P-type epitaxial regions 320, 322 while masking the N-type regions 314, 316, 318 and deep trench isolation regions 324, 326. In the illustrated embodiment of FIG. 8, the lateral edges of the implantation mask 333 are offset from lateral boundaries of the interior shallow isolation regions 330, 332 to expose portions of the peripheral shallow isolation regions 330, 332 so that the subsequently formed P-well regions 336, 338 extend laterally beneath the shallow isolation regions 330, 332. The P-well regions 336, 338 are then formed by implanting P-type ions, such as boron ions, illustrated by arrows 335, in the exposed portions of the epitaxial regions 320, 322 with a dopant concentration that is greater than the dopant concentration of the P-type epitaxial regions 320, 322, preferably within the range of $1\times10^{17}/cm^3$ to about $1\times10^{19}/cm^3$, and more preferably about $4\times10^{17}/cm^3$, and at an energy level in the range of about 100 keV to about 1500 keV to provide the P-well regions 336, 338 with a depth (after subsequent thermal annealing or any other diffusion) that is greater than a depth of the shallow isolation regions 328, 330, 332, 334 but less than the thickness of the epitaxial layer 312, so that at least a portion of the lighter doped P-type epitaxial layer 312 remains vertically between the P-well regions 336, 338 and the N-type buried region 308. In accordance with one or more exemplary embodiments, the depth of the P-well regions 336, 338 is greater than 0.3 microns.

Turning now to FIG. 9, the illustrated fabrication process continues by masking the N-type regions 314, 316, 318 and the interior portions of the P-type well regions 336, 338 and forming second P-type well regions 340, 342 in the interior portion of a respective P-type epitaxial regions 320, 322 between a respective triggering well region 336, 338 and a peripheral N-type sinker region 314, 318. As described above, each of the second P-well regions 340, 342 functions as a relatively lighter doped portion of the base electrode of a respective bipolar junction transistor element that provides an increased base resistance (e.g., base resistance 124, 126) between a respective base electrode contact region and the emitter electrode of that respective bipolar junction transistor element. In exemplary embodiments, the resistive P-well regions 340, 342 are formed within the respective transistor regions 320, 322 overlapping at least a portion of the respective triggering P-well region 336, 338 to provide intermediate P-type well regions 344, 346 having a higher dopant concentration than the triggering well regions 336, 338 and the resistive well regions 340, 342 by virtue of the combined doping in those intermediate regions 344, 346.

To fabricate P-well regions 340, 342, the protection device structure 300 is masked with a masking material 339 that is patterned to provide an implantation mask that exposes portions of the P-type epitaxial regions 320, 322 residing between the peripheral N-type regions 314, 318 and the triggering P-well regions 336, 338 while also exposing peripheral portions of the P-well regions 336, 338 and masking interior portions of the triggering well regions 336, 338, the interior N-type sinker region 316, and the interior shallow isolation regions 330, 332. In the illustrated embodiment of FIG. 9, the lateral edges of the implantation mask 339 are offset from lateral boundaries of the peripheral shallow isolation regions 328, 334 to expose portions of the peripheral shallow isolation regions 328, 334 so that the subsequently formed resistive P-well regions 340, 342 extend laterally beneath the shallow isolation regions 328, 334. The resistive P-well regions 340, 342 are then formed by implanting P-type ions, such as boron ions, illustrated by arrows 341, in the exposed portions of the epitaxial regions 320, 322 and triggering well regions 336, 338 with a dopant concentration that is greater than the dopant concentration of the P-type epitaxial layer 312 but less than the dopant concentration of the triggering well regions 336, 338, preferably within the range of about $1\times10^{15}/cm^3$ to about $1\times10^{15}/cm^3$, and more preferably about $1\times10^{15}/cm^3$ to about $1\times10^{17}/cm^3$, and at an energy level in the range of about 100 keV to about 1500 keV to provide the resistive P-well regions 340, 342 with a depth (after subsequent thermal annealing or any other diffusion) that is greater than a depth of the shallow isolation regions 328, 330, 332, 334 but less than the thickness of the epitaxial layer 312, so that at least a portion of the lighter doped P-type epitaxial layer 312 remains vertically between the resistive P-well regions 340, 342 and the N-type buried region 308. In accordance with one or more exemplary embodiments, the depth of the resistive P-well regions 340, 342 is greater than 0.3 microns. Although FIG. 9 illustrates the depth of the resistive P-well regions 340, 342 as being equal to the depth of the triggering well regions 336, 338, in other embodiments, the depth of the resistive P-well regions 340, 342 may be greater than or less than the depth of the triggering well regions 336, 338.

Turning now to FIG. 10, after forming the triggering and resistive base regions 336, 338, 340, 342, the illustrated fabrication process continues by masking the N-type regions 314, 316, 318 and the triggering and resistive base regions 336, 338, 340, 342 with a masking material 343 that is patterned to provide an implantation mask that exposes the intermediate regions 344, 346 residing between the respective triggering base regions 336, 338 and the respective resistive base regions 340, 342. The intermediate P-well regions 344, 346 are then further doped by implanting P-type ions, such as boron ions, illustrated by arrows 345, in the exposed regions 344, 346 with a dopant concentration that is greater than the dopant concentration of the triggering well regions 336, 338, preferably within the range of about $5 \times 10^{17}/cm^3$ to about $1 \times 10^{20}/cm^3$, and more preferably about $1 \times 10^{18}/cm^3$ to about $1 \times 10^{20}/cm^3$, and at an energy level in the range of about 100 keV to about 1500 keV to provide the current gain control P-well regions 344, 346 with a depth (after subsequent thermal annealing or any other diffusion) that is greater than a depth of the shallow isolation regions 328, 330, 332, 334 but less than the thickness of the epitaxial layer 312, so that at least a portion of the lighter doped P-type epitaxial layer 312 remains vertically between the gain control P-well regions 344, 346 and the N-type buried region 308. In accordance with one or more exemplary embodiments, the depth of the gain control P-well regions 344, 346 is greater than 0.3 microns. Although FIG. 10 illustrates the depth of the gain control P-well regions 344, 346 as being equal to the depth of the triggering P-well regions 336, 338 and the resistive P-well regions 340, 342, in other embodiments, the depth of the resistive P-well regions 340, 342 may be greater than or less than the depth of the triggering P-well regions 336, 338 and/or the resistive P-well regions 340, 342.

Figure 11:
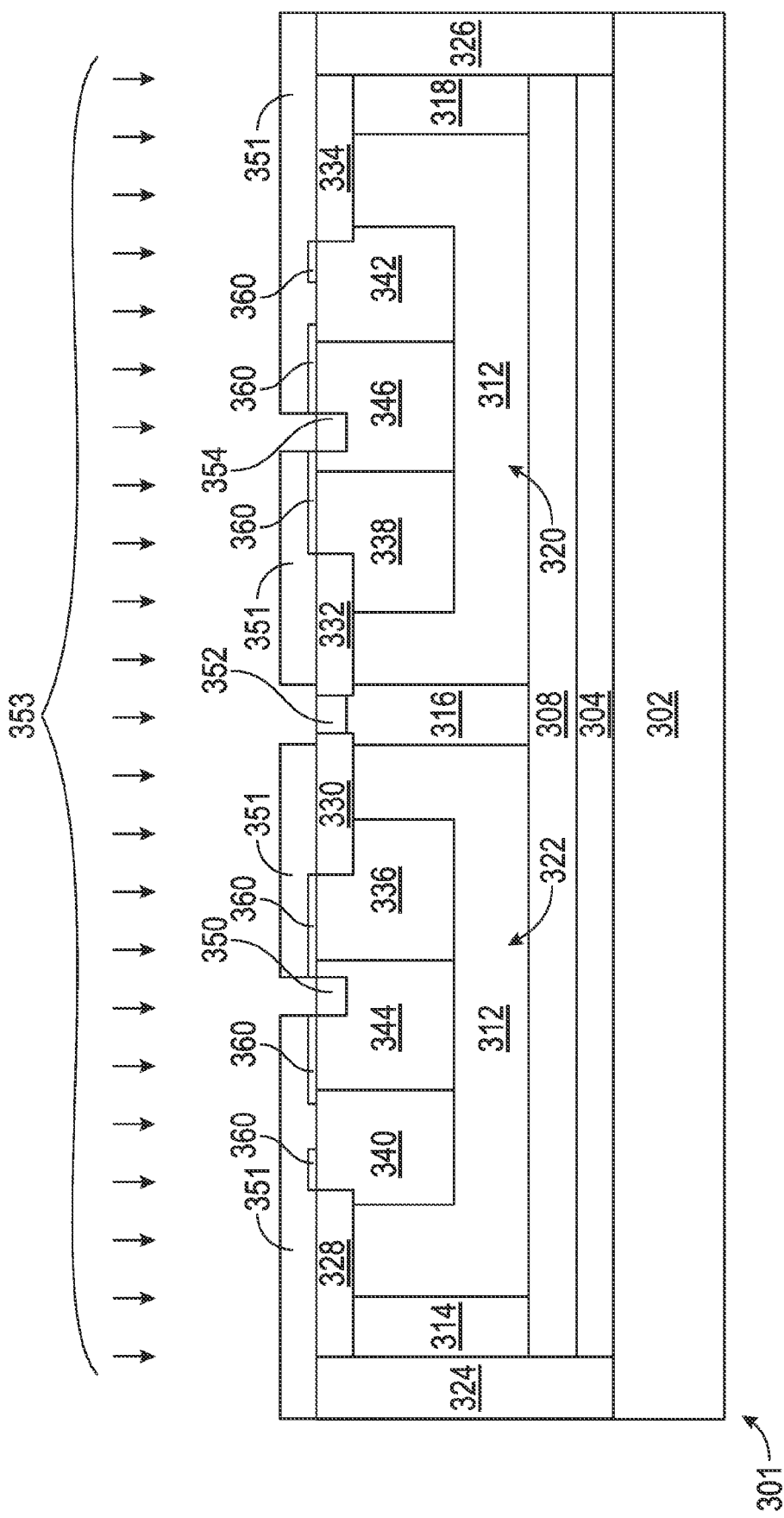
Figure 12:
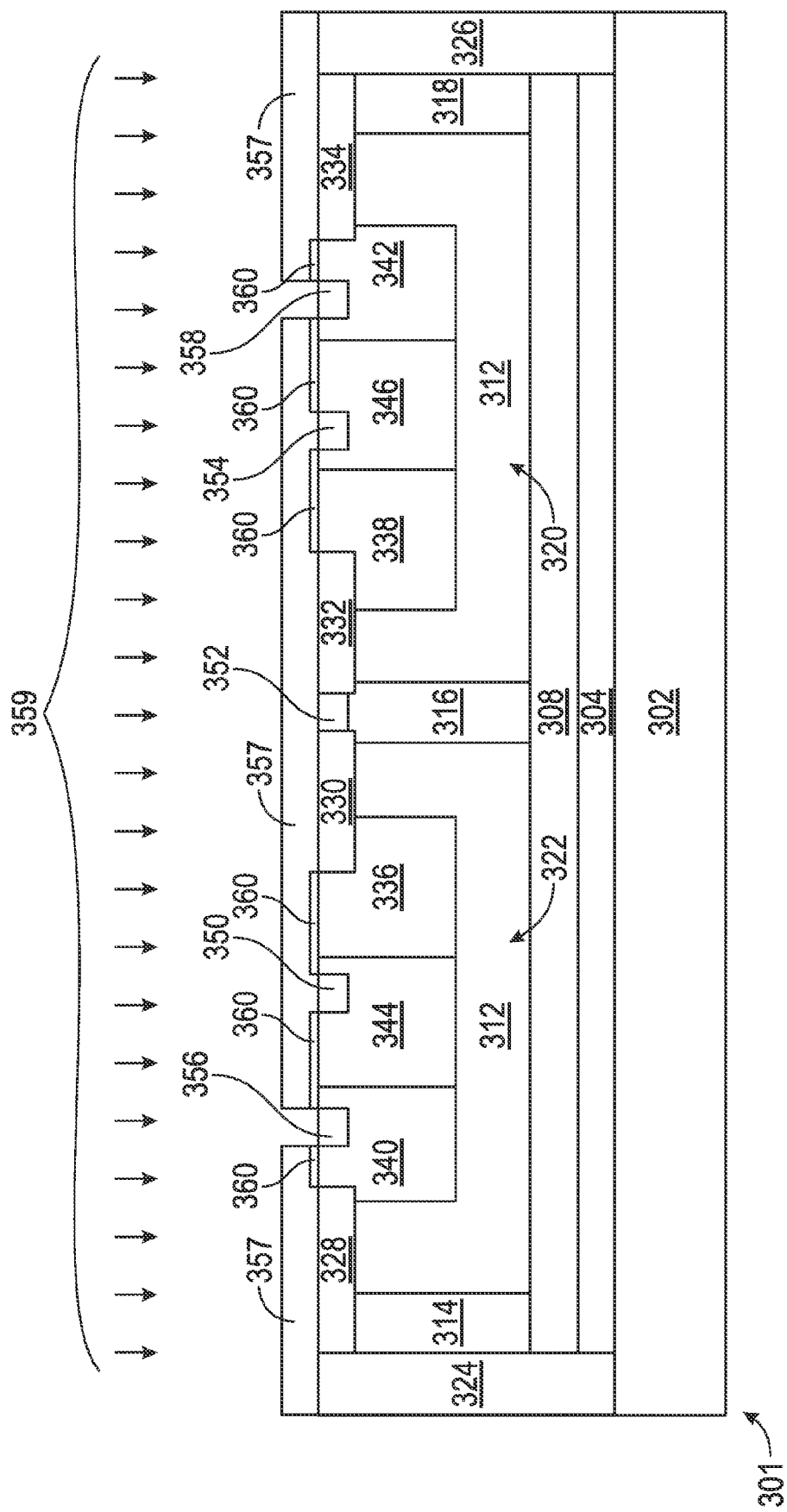

Referring now to FIGS. 11-12, after forming the P-well regions 336, 338, 340, 342, 344, 346 the fabrication process continues by appropriately masking the protection device structure 300, forming shallow N-type contact regions 350, 352, 354 within the current gain control P-well regions 344, 346 and the N-type sinker region 316, and forming shallow P-type contact regions 356, 358 within the resistive P-well regions 340, 342. Each of the N-type regions 350, 354 functions as a relatively higher doped emitter electrode for a respective BJT 120, 122, N-type region 352 functions as a relatively higher doped collector electrode contact region for the shared collector of the BJTs 120, 122, and each of the P-type regions 356, 358 functions as a relatively higher doped base electrode contact region for a respective BJT 120, 122. In this regard, as described above, the N-type emitter region 354, the P-type base regions 338, 342, 346, 358 and the N-type collector regions 308, 316 function as the first BJT 120 of the protection circuitry 108 while the second N-type emitter region 350, the second P-type base regions 336, 340, 344, 356 and the N-type collector regions 308, 316 function as the second BJT 122 of the protection circuitry 108.

In exemplary embodiments, prior to forming the shallow N-type and P-type contact regions, spaced apart silicide blocking regions 360 are formed overlying the P-well regions 336, 338, 340, 342, 344, 346. In this regard, the silicide blocking regions 360 prevent subsequent formation of silicide material on the portions of the P-well regions 336, 338, 340, 342, 344, 346 between neighboring shallow contact regions. The silicide blocking regions 360 include one or more silicide blocking materials, such as, one or more oxide materials and/or one or more nitride materials. For example, in one embodiment, the silicide blocking regions 360 are formed by forming a layer of oxide material (which may function as a gate dielectric for other devices on the wafer), forming a layer of nitride material overlying the oxide material, and etching the oxide and nitride materials to expose the portions of the P-well regions 340, 342, 344, 346 to be used for the shallow contact regions while the remaining silicide blocking material overlying the P-well regions 336, 338, 340, 342, 344, 346 remains intact.

After forming the silicide blocking regions 360, the shallow N-type contact regions 350, 352, 354 are formed by masking the protection device structure 300 with a masking material 351 that is patterned to expose the interior portions of the gain control well regions 344, 346 and the central portion of the N-type region 316 between shallow isolation regions 330, 332, as illustrated by FIG. 11. The shallow N-type regions 350, 352, 354 are then formed by implanting N-type ions, such as phosphorous ions or arsenic ions, illustrated by arrows 353, in the exposed portions of the regions 316, 344, 346 with a dopant concentration in the range of about $5 \times 10^{19}/cm^3$ to about $1 \times 10^{21}/cm^3$ and at an energy level in the range of about 20 keV to about 100 keV to provide the N-type regions 350, 352, 354 with a depth (after diffusion) that is less than a depth of the shallow isolation regions 328, 330, 332, 334. For example, in accordance with one or more embodiments, the depth of the shallow N-type regions 350, 352, 354 is in the range of about 0.05 microns to about 0.3 microns. In the illustrated embodiment, each emitter contact region 350, 354 is formed or otherwise resides within a respective higher conductivity current gain control base well region 344, 346 such that the respective gain control well region 344, 346 encompasses, surrounds and/or abuts the respective emitter contact region 350, 354.

Referring to FIG. 12, in a similar manner, the shallow P-type contact regions 356, 358, are formed by masking the protection device structure 300 with a masking material 357 that is patterned to expose the interior portions of the resistive P-well regions 340, 342. After the masking material 357 is patterned, the shallow P-type regions 356, 358 are formed by implanting P-type ions, such as boron ions, illustrated by arrows 359, in the exposed portions of the resistive P-well regions 340, 342 with a dopant concentration in the range of about $5 \times 10^{19}/cm^3$ to about $1 \times 10^{21}/cm^3$ and at an energy level in the range of about 2 keV to about 50 keV to provide the P-type regions 356, 358 with a depth (after diffusion) that is less than a depth of the shallow isolation regions 328, 330, 332, 334 (e.g., in the range of about 0.05 microns to about 0.3 microns). In this regard, each of the base electrode contact regions 356, 358 is encompassed or otherwise surrounded by the respective resistive P-well region 340, 342 it is formed within. In the illustrated embodiment, the base electrode contact region 356 abuts or otherwise contacts the resistive well region 340, which abuts or otherwise contacts the current gain control well region 344 to provide an electrical connection between the base electrode contact region 356 and the current gain control well region 344 via the resistive well region 340. Similarly, the base electrode contact region 358 abuts or otherwise contacts the resistive well region 342, which abuts or otherwise contacts the current gain control well region 346 to provide an electrical connection between the base electrode contact region 358 and the current gain control well region 346 via the resistive well region 342.

Turning now to FIG. 13, after forming the shallow N-type and P-type regions, fabrication of the protection device structure 300 may be completed by forming contacts 362 on the base electrode contact regions 356, 358 and the emitter electrode contact regions 350, 354, providing electrical connections between the respective base and emitter electrodes of the respective bipolar junction transistor elements, and providing electrical connections to/from the electrically connected base and emitter electrodes of the respective bipolar junction transistor elements and a respective physical interface 372, 374 of the electronic device that includes the protection device structure 300. The contacts 362 may be realized as a metal silicide layer formed by conformably depositing a layer of silicide-forming metal onto the exposed surfaces of the base electrode contact regions 356, 358 and the emitter electrode contact regions 350, 354 and heating the protection device structure 300, for example by rapid thermal annealing (RTA), to react the silicide-forming metal with the exposed silicon and form the metal silicide layer 362 at the top of the electrode contact regions 350, 354, 356, 358 that are not masked by the silicide blocking regions 360.

After the contacts 362 are formed, the fabrication process continues by forming a layer of dielectric material 364 overlying the protection device structure 300, removing portions of the dielectric material 364 overlying the base electrode contact regions 356, 358 and the emitter electrode contact regions 350, 354 to expose the contacts 362, and forming a conductive material 366 overlying the exposed base and emitter contacts 362. The dielectric material 364 may be realized as an interlayer dielectric material, such as an oxide material, that is conformably deposited overlying the protection device structure 300 in a conventional manner. Portions of the dielectric material 364 overlying the base electrode contact regions 356, 358 and the emitter electrode contact regions 350, 354 are removed by etching the dielectric material 364 using an anisotropic etchant to provide voided regions overlying the base and emitter contacts 362, and the conductive material 366 may be formed in the voided regions by conformably depositing a metal material overlying the protection device structure 300 to a thickness that is greater than or equal to the thickness of the dielectric material 364. As illustrated, the conductive material 366 may be patterned, routed, or otherwise formed to provide a direct electrical connection between the base and emitter electrode of a respective bipolar junction transistor element, thereby effectively short-circuiting the base and emitter of the bipolar junction transistor elements together. Additionally, the conductive material 366 is patterned, routed, or otherwise formed to provide an electrical connection between the electrode regions 350, 354, 356, 358 of a respective bipolar junction transistor element and a respective physical interface 372, 374 of the electronic device. In exemplary embodiments, the dielectric material 364 overlying the collector contact 362 remains intact so that the collector regions 308, 314, 316, 318 are floating and not directly connected to any device terminals or any other external circuitry that could ground or otherwise influence the electrical potential of the common collector.

It should be noted that although FIG. 13 depicts the protection device structure 300 as including three differently doped base well regions 336, 340, 344 on the BJT 122, in practice, any number of differently doped base well regions may be present in a practical embodiment. For example, another doped P-type region having a dopant concentration in between the lighter doped resistive P-well region 340 and the higher doped gain control P-well region 344 may be formed between the regions 340, 344. In a similar manner, a doped P-type region having a dopant concentration in between the triggering P-well region 336 and the gain control P-well region 344 may be formed between the regions 336, 344. In this regard, any number (e.g., more than the 3 depicted by FIGS. 8-10) of overlapping ion implantations corresponding to differently doped base well regions can be used to form the higher doped gain control P-well regions 344, 346. Moreover, in some embodiments, the base electrode contact region 356 may be formed in the epitaxial layer 312 rather than a lighter doped well region to provide an increased base resistance that further reduces the transient triggering voltage, in a similar manner as described in the context of FIG. 14 of U.S. patent application Ser. No. 13/900,226, which is incorporated herein by reference. In other words, the resistive well region may be realized as a portion of the epitaxial layer 312. Similarly, in various embodiments, the BJT 120 may include any number of differently doped base well regions and/or the base electrode contact region 358 may be formed in the epitaxial layer 312 to suit the needs or objectives of a particular application. In exemplary embodiments, a ratio of the dopant concentration of the triggering base well regions 336, 338 to the dopant concentration of the resistive base well regions 340, 342 is greater than or equal to 1.5, and more preferably in range of about 5 to about 10 or more, and similarly, the ratio of the dopant concentration of the gain control base well regions 344, 346 to the dopant concentration of the triggering base well regions 336, 338 is greater than or equal to 1.5, and more preferably in range of about 5 to about 10 or more.

Figure 14:
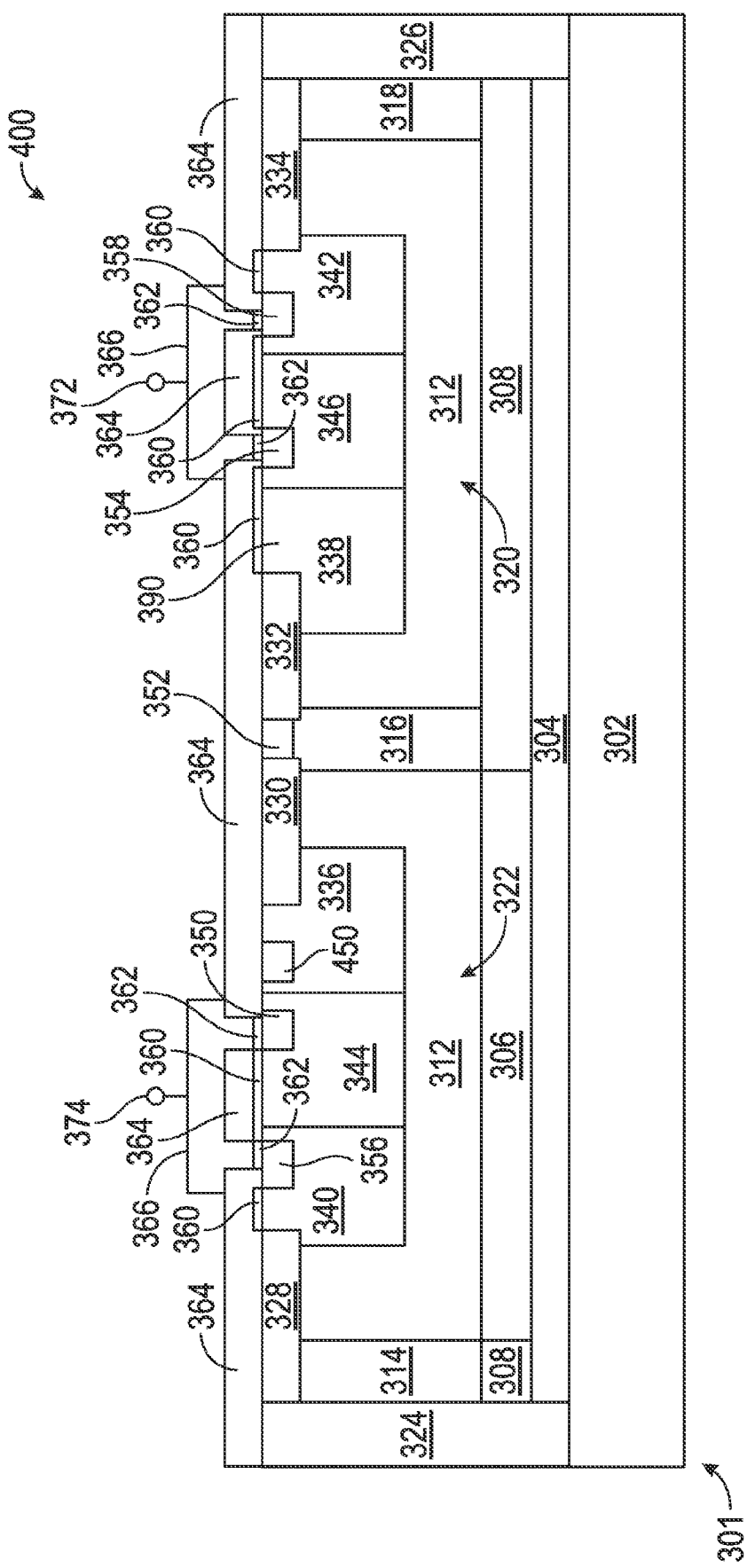
FIG. 14 illustrates, in cross section, an alternative embodiment of a protection device structure suitable for use with the electronic device of FIG. 1 in accordance with another embodiment of the invention.

Referring now to FIG. 14, in accordance with one or more embodiments, to increase holding voltage, the high conductivity current gain control well region 344 of the BJT 122 in a protection device structure 400 may include an electrically floating doped region 450 formed therein, with the floating region 450 being disposed laterally between the emitter region 350 and the collector region 316 to reduce the current gain ($\beta$) of the BJT 122. The doped region 450 is floating in that it is not directly connected to any device terminals 372, 374 or any other external circuitry that could ground or otherwise influence the electrical potential of the doped region 450. In exemplary embodiments, the floating region 450 has the opposite conductivity type with respect to the current gain control well region 344. For example, the floating P-type region 450 may reside laterally between the N-type emitter region 350 and the N-type collector region 316 to modulate the base (or hole) current. In this manner, the floating region is configured to reduce the current gain of the BJT 122 after it is triggered (or turned on). By reducing the current gain, the holding voltage of the BJT 122 is increased, which, in turn, increases the holding voltage of the protection circuitry 108 and/or the protection device structure 400.

Referring to FIG. 12, to form the P-type floating region 450, the masking material 357 is patterned to expose the portion of the current gain control P-well region 344 corresponding to the P-type floating region 450 so that the P-type floating region 450 is formed concurrently to the P-type base electrode contact regions 356, 358 when implanting ions 359. In alternative embodiments, the floating region 450 may be formed within the triggering region 336 rather than the current gain control well region 344 (or overlapping both regions 336, 344), however, forming the floating region 450 within the current gain control well region 344 provides a higher holding voltage. Although not illustrated, in some embodiments, the current gain control well region 346 of BJT 120 may also include an electrically floating region formed therein to increase the holding voltage in the reverse direction. Furthermore, in some embodiments, an additional floating region having the same conductivity type of the emitter region 350 may be added into one of the base well regions 336, 344 and disposed laterally between the floating region 450 and the collector region 316 and electrically connected to (or short-circuited with) the floating region 450 to supply electrons that further reduce the current gain, in a similar manner as described in the context of FIG. 15 of U.S. patent application Ser. No. 13/900,226.

As illustrated in FIG. 14, in some embodiments, to further increase the holding voltage, the portion of the buried region 308 underlying the base well regions 336, 340, 344 of the BJT 122 may be removed. For example, referring again to FIG. 4 with reference to FIG. 14, to prevent the buried region 308 from extending underneath the base well regions 336, 340, 344, the portion of the substrate 301 corresponding to transistor region 322 and/or base well regions 336, 340, 344 may be masked with masking material 309 prior to implanting ions 310 so that the buried region 308 does not extend across the transistor region 322. In this regard, the buried region 308 underlies the base well regions 338, 342, 346 and/or the transistor region 320 for BJT 120 and abuts the central sinker region 316 to provide an electrical connection between the buried region 308 and the central collector region 316, while the semiconductor material of the seed layer 306 underlying the base well regions 336, 340, 344 and/or transistor region 322 for BJT 122 remains intact overlying the buried layer 304. In this regard, the remaining portion of the seed layer 306 laterally abuts the buried region 308 about the perimeter (or periphery) of the transistor region 322, or, in other words, the buried region 308 circumscribes or otherwise laterally encloses the remaining portion of the seed layer 306 underlying the base well regions 336, 340, 344.

For the sake of brevity, conventional techniques related to semiconductor and/or integrated circuit fabrication, ESD protection schemes, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

The foregoing detailed description is merely illustrative in nature and is not intended to limit the embodiments of the subject matter or the application and uses of such embodiments. Andy implementation described herein as exemplary is not necessarily to be construed as preferred or advantageous over other implementations. Additionally, there is no intention to be bound by any expressed or implied theory presented in the preceding technical field, background or the detailed description.

In conclusion, systems, devices, and methods configured in accordance with example embodiments of the invention relate to:

An apparatus is provided for a semiconductor device having a protection circuit that comprises a first region of semiconductor material having a first conductivity type and a first dopant concentration, a second region of semiconductor material having a second conductivity type opposite the first conductivity type, a third region of semiconductor material having the first conductivity type and a second dopant concentration that is greater than the first dopant concentration, wherein at least a portion of the third region is disposed between the first region and the second region, a fourth region of semiconductor material having the first conductivity type and a third dopant concentration that is different from the second dopant concentration and different from the first dopant concentration, wherein at least a portion of the fourth region is disposed between the second region and the third region, a fifth region of semiconductor material having the first conductivity type, and a sixth region of semiconductor material within the third region, the sixth region having the second conductivity type, wherein at least a portion of the first region is disposed between the fifth region and the sixth region. In one embodiment, the fifth region and the sixth region are electrically connected. In another embodiment, the fifth region resides within the first region. In another embodiment, the fifth region is electrically connected to the third region via the portion of the first region disposed between the fifth region and the sixth region. In accordance with one or more embodiments, the first region comprises a first base well region, the second region comprises a collector region, the third region comprises a second base well region, the fourth region comprises a third base well region, the fifth region comprises a base contact region, and the sixth region comprises an emitter region. In a further embodiment, the first base well region comprises a resistive base well region, the second base well region comprises a current gain control base well region, and the third base well region comprises a triggering base well region. In another embodiment, the second dopant concentration is greater than the third dopant concentration. In a further embodiment, the third dopant concentration is greater than the first dopant concentration and the fifth region has a fourth dopant concentration greater than the second dopant concentration. In one embodiment, the semiconductor device further comprises a seventh region of semiconductor material within the third region, the seventh region having the first conductivity type and a fourth dopant concentration greater than the second dopant concentration, wherein the seventh region is disposed between the sixth region and the second region. In a further embodiment, the fifth region and the sixth region are electrically connected and coupled to a terminal and the seventh region is floating. In another embodiment, the semiconductor device further comprises a seventh region of semiconductor material between the second region and the fourth region, the seventh region having the first conductivity type and a fourth dopant concentration less than the first dopant concentration. In a further embodiment, the semiconductor device further comprises a buried region of semiconductor material having the second conductivity type, wherein the buried region is electrically connected to the second region, the seventh region overlies the buried region, and the first region, the third region, and the fourth region overlie the seventh region. The semiconductor device may further comprise a substrate including a handle layer of semiconductor material and a buried layer of dielectric material overlying the handle layer, wherein the buried region overlies the buried layer of dielectric material. In yet another embodiment, a first ratio of the third dopant concentration to the first dopant concentration is greater than or equal to 1.5 and a second ratio of the second dopant concentration to the third dopant concentration is greater than or equal to 1.5. In another embodiment, the first dopant concentration is less than or equal to $1 \times 10^{17}/cm^3$, the second dopant concentration is greater than or equal to $1 \times 10^{18}/cm^3$, and the third dopant concentration is greater than the first dopant concentration and less than the second dopant concentration.

In another embodiment, a protection device structure is provided. The protection device structure comprises a first base well region of semiconductor material having a first conductivity type and a first dopant concentration, a second base well region of semiconductor material having the first conductivity type and a second dopant concentration that is less than the first dopant concentration, the second base well region abutting the first base well region, a base contact region of semiconductor material having the first conductivity type and a third dopant concentration that is greater than the second dopant concentration, wherein at least a portion of the second base well region resides between the base contact region and the first base well region, a third base well region of semiconductor material having the first conductivity type and a fourth dopant concentration that is greater than the second dopant concentration and different than the first dopant concentration, the third base well region abutting the first base well region, an emitter region of semiconductor material within the first base well region, the emitter region having a second conductivity type opposite the first conductivity type, wherein the emitter region and the base contact region are electrically connected, and a collector region of semiconductor material having the second conductivity type, wherein at least a portion of the third base well region resides between the emitter region and the collector region. In one embodiment, the third base well region and the collector region are spaced apart by a distance.

In another embodiment, a method of fabricating a protection device structure on a semiconductor substrate is provided. The method comprises forming a first base well region of semiconductor material in the semiconductor substrate, the first base well region having a first conductivity type and a first dopant concentration, forming a second base well region of semiconductor material in the semiconductor substrate, the second base well region having the first conductivity type and a second dopant concentration different from the first dopant concentration, forming an emitter region of semiconductor material within the first base well region, the emitter region having a second conductivity type opposite the first conductivity type, wherein at least a portion of the second base well region is disposed between the emitter region and a collector region of semiconductor material having the second conductivity type, and forming a base contact region of semiconductor material in the semiconductor substrate, the base contact region having the first conductivity type and being spaced apart from the first base well region, wherein a portion of semiconductor material having the first conductivity type and a dopant concentration that is less than the first dopant concentration is disposed between the base contact region and the first base well region. In one embodiment, the method further comprises forming a third base well region of semiconductor material in the semiconductor substrate, the third base well region having the first conductivity type and a third dopant concentration that is less than the first dopant concentration and the second dopant concentration, wherein forming the base contact region comprises forming the base contact region within the third base well region and the portion of semiconductor material comprises a portion of the third base well region disposed between the base contact region and the first base well region. In another embodiment, forming the second base well region comprises implanting first ions of the first conductivity type and the second dopant concentration in the second base well region of the semiconductor substrate, forming the third base well region comprises implanting second ions of the first conductivity type and the third dopant concentration in the third base well region of the semiconductor substrate, and forming the first base well region comprises implanting the first ions in the first base well region of the semiconductor substrate concurrently to implanting the first ions in the second base well region of the semiconductor substrate and implanting the second ions in the first base well region of the semiconductor substrate concurrently to implanting the second ions in the third base well region of the semiconductor substrate.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device having a protection circuit, the protection circuit comprising:
   a first region of semiconductor material having a first conductivity type and a first dopant concentration;
   a second region of semiconductor material having a second conductivity type opposite the first conductivity type;
   a third region of semiconductor material having the first conductivity type and a second dopant concentration that is greater than the first dopant concentration, wherein at least a portion of the third region is disposed between the first region and the second region;
   a fourth region of semiconductor material having the first conductivity type and a third dopant concentration that is different from the second dopant concentration and different from the first dopant concentration, wherein at least a portion of the fourth region is disposed between the second region and the third region;
   a fifth region of semiconductor material having the first conductivity type; and
   a sixth region of semiconductor material within the third region, the sixth region having the second conductivity type, wherein at least a portion of the first region is disposed between the fifth region and the sixth region.

2. The semiconductor device of claim 1, further comprising a seventh region of semiconductor material between the second region and the fourth region, the seventh region having the first conductivity type and a fourth dopant concentration less than the first dopant concentration.

3. The semiconductor device of claim 2, further comprising a buried region of semiconductor material having the second conductivity type, wherein:
   the buried region is electrically connected to the second region;
   the seventh region overlies the buried region; and
   the first region, the third region, and the fourth region overlie the seventh region.

4. The semiconductor device of claim 3, further comprising a substrate including a handle layer of semiconductor material and a buried layer of dielectric material overlying the handle layer, wherein the buried region overlies the buried layer of dielectric material.

5. The semiconductor device of claim 1, wherein:
   the first region comprises a first base well region;
   the second region comprises a collector region;
   the third region comprises a second base well region;
   the fourth region comprises a third base well region;

the fifth region comprises a base contact region; and
the sixth region comprises an emitter region.

6. The semiconductor device of claim 5, wherein:
the first base well region comprises a resistive base well region;
the second base well region comprises a current gain control base well region; and
the third base well region comprises a triggering base well region.

7. The semiconductor device of claim 1, wherein the second dopant concentration is greater than the third dopant concentration.

8. The semiconductor device of claim 7, wherein:
the third dopant concentration is greater than the first dopant concentration; and
the fifth region has a fourth dopant concentration greater than the second dopant concentration.

9. The semiconductor device of claim 1, further comprising a seventh region of semiconductor material within the third region, the seventh region having the first conductivity type and a fourth dopant concentration greater than the second dopant concentration, wherein the seventh region is disposed between the sixth region and the second region.

10. The semiconductor device of claim 9, wherein:
the fifth region and the sixth region are electrically connected and coupled to a terminal; and
the seventh region is floating.

11. The semiconductor device of claim 1, wherein the fifth region and the sixth region are electrically connected.

12. The semiconductor device of claim 1, wherein the fifth region resides within the first region.

13. The semiconductor device of claim 1, wherein the fifth region is electrically connected to the third region via the portion of the first region disposed between the fifth region and the sixth region.

14. The semiconductor device of claim 1, wherein:
a first ratio of the third dopant concentration to the first dopant concentration is greater than or equal to 1.5; and
a second ratio of the second dopant concentration to the third dopant concentration is greater than or equal to 1.5.

15. The semiconductor device of claim 1, wherein:
the first dopant concentration is less than or equal to $1 \times 10^{17}/cm^3$;
the second dopant concentration is greater than or equal to $1 \times 10^{18}/cm^3$; and
the third dopant concentration is greater than the first dopant concentration and less than the second dopant concentration.

16. A protection device structure comprising:
a first base well region of semiconductor material having a first conductivity type and a first dopant concentration;
a second base well region of semiconductor material having the first conductivity type and a second dopant concentration that is less than the first dopant concentration, the second base well region abutting the first base well region;
a base contact region of semiconductor material having the first conductivity type and a third dopant concentration that is greater than the second dopant concentration, wherein at least a portion of the second base well region resides between the base contact region and the first base well region;
a third base well region of semiconductor material having the first conductivity type and a fourth dopant concentration that is greater than the second dopant concentration and different than the first dopant concentration, the third base well region abutting the first base well region;
an emitter region of semiconductor material within the first base well region, the emitter region having a second conductivity type opposite the first conductivity type, wherein the emitter region and the base contact region are electrically connected; and
a collector region of semiconductor material having the second conductivity type, wherein at least a portion of the third base well region resides between the emitter region and the collector region.

17. The protection device structure of claim 16, wherein the third base well region and the collector region are spaced apart by a distance.

18. The protection device structure of claim 16, wherein the base contact region resides within the second base well region.

19. The protection device structure of claim 16, further comprising a floating region of semiconductor material having the first conductivity type within the third base well region.

20. The protection device structure of claim 19, wherein the floating region is disposed between the emitter region and the collector region.

* * * * *